(12) United States Patent
Carvalho et al.

(10) Patent No.: US 11,211,900 B2
(45) Date of Patent: Dec. 28, 2021

(54) MULTI QUANTIZED DIGITALLY CONTROLLED POWER SUPPLY VOLTAGE FOR MULTI AMPLIFIER STAGES

(71) Applicants: Paulo Carvalho, Lisbon (PT); Rui Dinis, Costa da Caparica (PT); Luis Campos, Corroios (PT); Hugo Serra, Mem Martins (PT); João Oliveira, Parede (PT); Ricardo Madeira, Lisbon (PT); Ricardo Laires, Sacavem (PT)

(72) Inventors: Paulo Carvalho, Lisbon (PT); Rui Dinis, Costa da Caparica (PT); Luis Campos, Corroios (PT); Hugo Serra, Mem Martins (PT); João Oliveira, Parede (PT); Ricardo Madeira, Lisbon (PT); Ricardo Laires, Sacavem (PT)

( * ) Notice: Subject to any disclaimer, the term of this patent is extended or adjusted under 35 U.S.C. 154(b) by 67 days.

(21) Appl. No.: 16/503,485

(22) Filed: Jul. 4, 2019

(65) Prior Publication Data
US 2021/0006207 A1 Jan. 7, 2021

(51) Int. Cl.
*H03F 3/04* (2006.01)
*H03F 1/02* (2006.01)
*H03F 3/193* (2006.01)
*H03F 3/21* (2006.01)
*H03F 3/217* (2006.01)

(52) U.S. Cl.
CPC ........... *H03F 1/0227* (2013.01); *H03F 3/193* (2013.01); *H03F 3/211* (2013.01); *H03F 3/2178* (2013.01); *H03F 2200/102* (2013.01)

(58) Field of Classification Search
CPC ...... H03F 1/0227; H03F 3/2178; H03F 3/193; H03F 3/211; H03F 2200/102; H03F 1/0244; H03F 1/0211; H03F 2200/504; H03F 3/04; H03G 3/3042; H03G 3/004; H03G 3/3036; H03G 3/001
USPC ......................................... 330/127, 129, 297
See application file for complete search history.

(56) References Cited

U.S. PATENT DOCUMENTS

| | | | |
|---|---|---|---|
| 7,937,049 B2 * | 5/2011 | Phillips | H03F 1/0222 455/114.3 |
| 8,289,084 B2 * | 10/2012 | Morimoto | H03F 3/45475 330/297 |
| 9,020,453 B2 * | 4/2015 | Britta | H04B 1/0475 455/102 |

* cited by examiner

*Primary Examiner* — Khanh V Nguyen

(57) ABSTRACT

Methods and systems for power amplification with digital quantized power supply with multiple amplifiers are disclosed herein. In one embodiment, In one embodiment, a time-varying envelope signal is sampled, quantized and decomposed into several constituent signals that are individually amplified, and then combined to form a desired amplified version of the quantized time-varying envelope. Amplitude, phase and/or frequency characteristics of one or more of the signals and supply voltages $V_{dd}$ and source current of one or more amplifiers are digital controlled based on the information provided by quantization process and slow and fast power control information. Amplitude, phase and/or frequency characteristics of one or more of the constituent signals to be amplified are controlled to provide the desired amplitude, phase, frequency, and/or spectral characteristics of the desired quantized version of the time-varying envelope signal.

20 Claims, 9 Drawing Sheets

MULTI QUANTIZED DIGITALLY CONTROLLED POWER SUPPLY VOLTAGE FOR MULTI AMPLIFIER STAGES

BACKGROUND OF THE INVENTION

Field of the Invention

The present invention relates generally to the amplification of variant envelope signals using an amplifier stage with multiple amplifiers in parallel. These amplifiers are controlled by sets of quantized collector supply voltages or quantized drain voltages (denoted as $V_{dd}$ or as supply voltages values $V_{dd}$) and signal amplification in transceivers used in telecommunications devices for mobile communications, wireless communications and wired communications systems.

Description of Related Art

In modern wireless communications, spectral efficiency should be fully optimized to be able to support high data rates. In limited bandwidth systems, this is done by adopting high order modulation methods characterized by high peak-to-average ratio (PAR) signals, which need significant back-off levels for linear operation [1]. This scheme is not always suitable for using traditional power amplifiers (PA), because the PA should be designed so that it can handle the peak power level while, in general, it needs to work at a much lower average output power [2]. Traditionally, linear PAs are biased to deliver the output power corresponding to the value of the peak radio frequency (RF) output power. Peak RF output power conditions generally occur when the RF input signal to the PA is at a maximum value. The traditional approach to linearly amplify a variant envelope modulated signal is to "back-off" the linear Class-A or Class-AB PA's output power until the distortion level is within acceptable limits. However, when the PA is "backed-off" from the peak RF output power conditions, the excess direct current (DC) input power must be dissipated by the PA because it is not being transformed into useful RF output power. Consequently, the PA efficiency is significantly decreased, especially for high PAR signals, which is the case of the signals commonly used in LTE and to be adopted in further generation of mobile communication systems.

Two metrics commonly used to measure the efficiency of a power amplifier include drain/collector efficiency (η) and power-added efficiency (PAE). Drain/collector efficiency η gives a measure of how much of the DC input power to a PA is converted to RF output power and is given by the ratio of the RF output power of the PA to the DC input power of the PA ($\eta = P_{out}/P_{DC}$). PAE primarily differs from drain/collector efficiency η in that it takes into consideration the power of the input RF signal of the PA. PAE is given by:

$$PAE = \left(\frac{P_{out} - P_{in}}{P_{DC}}\right) \times 100\%$$

where $P_{out}$ is the RF output power of the PA, $P_{DC}$ is the DC input power of the PA, and $P_{in}$ is the power of the RF input signal to the PA. Thus, it become obvious the advantages of reducing $P_{DC}$.

The efficiency of a RF power amplifier has a significant impact on the battery life of a portable device, such as a portable transmitter, because the amplifier typically consumes a significant amount of power used by the device. Unfortunately, the traditional tradeoff between linearity and efficiency in power amplifiers is such that the more linear a power amplifier is the less power efficient it is.

In power amplifiers, a complex tradeoff typically exists between linearity and power efficiency. Linearity is determined by a power amplifier's operating range on a characteristic curve that relates its input to output variables the more linear the operating range is the more linear the PA is said to be. Linearity is a desired characteristic of a PA. In one aspect, for example, it is desired that a power amplifier uniformly amplifies signals of varying amplitude, and/or phase and/or frequency. Accordingly, linearity is an important determiner of the output signal quality of a PA. The tradeoff described above is further accentuated by modern wired and wireless communications systems with strict requirements regarding spectral and power efficiencies. For example, wireless communication signals, such as orthogonal frequency-division multiplexing (OFDM) [3], coded division multiple access (CDMA) [4], wide band CDMA (W-CDMA), single carrier with frequency domain equalization (SC-FDE) [5] and orthogonal frequency division multiple access (OFDMA), are characterized by envelope fluctuations and high peak-to-average power ratios (PAPR), which may compromise amplification efficiency [6, 7, 8]. The larger the signal's PAPR the more nonlinear distortion will be produced when nonlinear amplifiers are employed. Other multi-carrier techniques such as filter bank multi-carrier with offset quadrature amplitude modulation (FBMC-OQAM) have the same drawback.

Since the PA is one of the most important components in the transmitter architecture it represents the most power consuming device. For example, in a base station under maximum load, PA power consumption represents more than 50% of the whole system's DC power consumption. Besides the heat problems, high power systems that work in back-off levels also increase the system complexity [9].

Over the years, several techniques have been proposed to enhance the efficiency in PAs. As example we can name, envelope elimination and restoration (EER) [10, 11, 12], predistortion [13, 14], Doherty [15, 16, 17], linear amplification with nonlinear control (LINC) [18, 19, 20, 21, 22, 23] and envelope tracking (ET) [24, 25, 26, 27, 28].

EER technique uses a combination of a switching-mode PA and an envelope remodulation circuit. However, several drawbacks exist for this architecture. Both the amplitude and phase signals are generated with nonlinear operations. Thus, the bandwidth of the original I/Q signal is significantly expanded in phase and in the envelope signal paths. Efficiency of the EER technique depends greatly on the efficiency of the envelope amplifier (EA). Since the overall system efficiency is now a product of the efficiencies of the envelope amplifier and the RF PA, degradation in the EA efficiency can offset any improvements in the efficiency of the RF PA.

In the basic Doherty power amplifier (DPA) scheme, the main amplifier is a Class-B or Class-AB amplifier (Class-AB is preferred for its higher linearity). However, it is designed to keep its maximum output voltage swing, and thus its maximum efficiency, for any input power level between the so-called break point and the maximum. In the classical DPA implementation the main maximum current contributes to half of the maximum total current, which sets the break point at 6 dB output power back-off (OBO). The auxiliary device is off for input powers below the break point value and is turned on when input power increases above this level. When active, it injects current into the common load, contributing to the total output power and modulating the load seen by the main amplifier. The drawbacks of this architecture are the limitations in terms of back-off and bandwidth. Moreover, practical DPA implementations present other issues, in terms of operating frequency and linearity, due to device non-ideality.

LINC technique separates the input signal S(t) in two constant envelope signals to be amplified separately by two highly efficient nonlinear amplifiers (e.g., class D and E amplifiers). In conventional LINC, an input signal S(t) with a time varying envelope is decomposed into two constant amplitude signals $S_1(t)$, $S_2(t)$ which can be summed to provide a desired output signal $S_{out}(t)$. A time varying envelope output signal is created as the sum of two constant-envelope signals $S_1(t)$, $S_2(t)$ by outphasing of the two constant envelope signals. Because the two signals $S_1(t)$, $S_2(t)$ are of constant amplitude, they can be synthesized with highly-efficient PAs including partially and fully switched mode designs such as classes D, E, F, E/F and current-mode D, inverse F, $\phi$, etc. These amplifiers can be made highly efficient, in part, because they do not need to have the capability to provide linear output control. Combining the two constant amplitude outputs $S_1(t)$, $S_2(t)$ in a power combining network enables the net output amplitude to be controlled via the relative phase of the two constituent components $S_1(t)$, $S_2(t)$. However, LINC transmitter scheme is limited by the envelope characteristics of its input signal. Since the amplitude information of the band-limited signal is embedded in the phase of the LINC components, a highly fluctuating envelope produces a constant envelope LINC component with high phase content, which is what causes the LINC components' spectrum to spread. Other problem with LINC is how the power combining is done, particularly because many high efficiency power amplifiers are highly sensitive to load impedance, and their performance and efficiency can heavily degrade due to interactions between the power amplifiers.

ET technique uses a linear PA and a supply modulation circuit where the supply voltage tracks the input envelope. The ET system even though it needs a more sophisticated supply modulator, it can improve the efficiency of the RF PA for amplification of the modulated RF signal with a high PAPR. By replacing the fixed supply with the dynamic supply voltage, the DC power consumption of the ET PA is reduced compared to that of the conventional PA, and the efficiency is significantly increased. ET involves the use of envelope tracking of the input signal to the amplifier and the use of the detected envelope to vary the amplifier operation. In an ET system, a variable power supply is used for supplying power to the amplifier. The envelope power levels of the input signal are monitored, and the power that is supplied to the power amplifier, or typically to the final stage(s) of the power amplifier, is varied based on the monitored envelope levels. More specifically, the power that is supplied to the amplifier is varied to be just enough to reproduce the power level required by the amplifier at a given instant of time. For low output powers the supply voltage is reduced and for high output powers it is increased. However, while envelope tracking amplifiers are easier to implement than their EER counterparts, they provide smaller efficiency benefits, since linear RF PAs need to be used.

The multi quantized digitally controlled power supply voltage for multi amplifier stages apparatus, proposed in this application, follows a different approach since it is applied to the quantized values of the time domain samples of the signal's envelope. Therefore, the quantization alphabet symbol $\mathfrak{S} = (s_0, s_1, \ldots, s_{M-1})$, may vary and the size of the alphabet $M = 2^{N_{bq}}$ only depends on the number of quantization bits. Thus, there is not a direct relation between the quantization constellation and the modulation applied to signal, whose time domain samples are quantized. Hence, the amplification process disclosed here, implements a linear amplification of a signal, with a time varying envelope through the transformation of the time domain samples' values into a quantized value and the decomposition of the quantized symbol, as a sum of quasi constant or constant envelope signals, that can be amplified by nonlinear amplifiers. Moreover, since the quantizer's inputs are the time domain samples of a signal's envelope, this decomposition can be applied to any signal and does not have a specific constellation as a target.

The quantizer based on the samples generates the quantization bits related with the amplitudes and phases of the components, in which each amplified version of the quantized version of the envelope can be decomposed. In one embodiment, the quantization bits are employed to select in a lookup table, the set with $N_{bq}$ supply voltage values $V_{dd}$, to be applied to the $N_{bq}$ amplifiers, and to generate a set of in-phase and quadrature components with different phases and amplitudes, that are combined to generate the $N_{bq}$ signals to be applied to the $N_{bq}$ current source or switched amplifiers. Each $V_{dd}$ of the set, with $N_{bq}$ values, is applied to only one amplifier in the $N_{bq}$ branches. Thus, amplifier's back-off is avoided since each amplifier is optimized for the corresponding $V_{dd}$. The amplified version of the quantized envelope is obtained by combining the $N_{bq}$ amplifiers outputs. In other embodiment the quantization bits are employed to select the set with $N_{bq}$ values of $V_{dd}$ to be applied to a set of $N_{bq}$ switched amplifiers and to generate a set of in-phase and quadrature components with the same amplitude and different phases that are combined and amplified to generate the amplified version of the quantized envelope. The main difference lies on the fact that the amplified version of the envelope is the result of the combination of the outputs of $N_{bq}$ amplifiers, where each output represents a component in which the quantized amplified version of the envelope can be decomposed. Thus, the method and the apparatuses disclosed in the present application are not restricted to a specific modulation or constellation, and the amplified version of the quantized envelope is the result of the combination of a plurality of output signals that result at the outputs of $N_{bq}$ amplifiers. Another key difference lies on the $V_{dd}$ control of each amplifier that can be constant over time, since it only depends on the quantization rule and the total output power needed for each transmitted information block. This also means that each amplifier is optimized to a specific power output according to the quantization rule defined by the quantizer and the lookup table, being the optimizations different for each amplifier in the set of $N_{bq}$ amplifiers in parallel. Besides the differences already mentioned, the distortion is mainly due to the quantization error $\varepsilon_{QT}$ that is defined in terms of the dynamic range of the signal's envelope received as input. Having in mind the main characteristics of the new concept of multi quantized digitally controlled multi amplifier stage, it follows that is totally different from the techniques referred in documents [10-28]. No envelope tracking is done by each one of the $N_{bq}$ amplifiers, since the envelope is the combination of the amplifier's outputs. Neither can be considered as an EER, since it does not use a combination of a switching-mode PA nor an envelope remodulation circuit. Now a plurality of amplitude and phase signals are generated by a quantizer that provides control information used to select the optimal set of supply voltage values $V_{dd}$ that optimize each amplifier individually. Bandwidth spreading of the original I/Q signal is also avoided, by employing constant envelope signals at the input of each amplifier.

Document [29] discloses an integrated transceiver employing an ET technique with a digital signal processing within a transceiver to perform envelope extraction and to provide appropriate delay matching of the envelope and main signal paths. The power supply voltage changes according to the level of power supplied to an amplifying circuit (by varying the voltage of the supply) in response to the variation of an input signal envelope directed to the power supply. The digital processing unit is employed to detect the input signal envelope and provide variation of the power supply level. The processing circuit also includes an envelope pre-distortion circuit to cope with nonlinearities in the envelope tracking power supply. The approach of the multi $V_{dd}$ digitally controlled multi amplifier stage disclosed in current application does not need an envelope power supply modulator, which means lower complexity in the power supply structure of the amplifiers. Also, nonlinear effects are avoided since the signals submitted to each amplifier have constant envelope, which also means that back-off is avoided in each amplifier and switched amplifiers can be employed in each branch. Also, according to the concept disclosed in the current application, the quantizer provides the digital control information to configure the $V_{dd}$ and the signals needed to control the combination of the outputs the amplified version of the envelope. Distortion occurs mainly due to the quantization effects associated to the definition of the set of $V_{dd}$ values, however by increasing the number of quantization levels these effects can be minimized.

In document [30] it is employed a digital control component to digitally generate an envelope voltage to the PA by switching resistors coupled between at least one of the supply voltages and the PA. The disclosed apparatus uses a digital control component to generate a digital code in response to the envelope input signal being received or detected at an envelope input to the digital control component. This digital control code can digitally operate or control various combinations of switches that can be a function of the envelope input voltage and generated by the digital control code and is able to facilitate envelope tracking to reach a very high bandwidth of modulation and reduces the output noise level. Based on the envelope, the digital control component generates a digital control code that facilitates switching of resistance values or resistances that can be defined by groups of switches (e.g., transistors). The digital control code provides different combinations of the switches that are coupled between one or more different supply voltages to generate an envelope voltage to the PA and track an input signal. Similarly, to other ET systems the envelope power levels of the input signal are monitored, and the power that is supplied to the PA, or typically to the final stage(s) of the power amplifier, is varied based on the monitored envelope levels. Contrarily to the embodiments disclosed in [30], the multi $V_{dd}$ apparatus and the corresponding embodiments disclosed in present application implements a digital control based on a quantizer and mapper that maps each envelope sample into several components. The quantizer provides the control information for a set of $N_{bq}$ different $V_{dd}$ values that should control $N_{bq}$ amplifiers in parallel. Also, there is no need to dynamically change the $V_{dd}$ set according to the sample value of the envelope in each instant. This appends, because the $V_{dd}$ set is defined by the quantizer and mapper that should assure at the outputs of the $N_{bq}$ amplifiers an amplified version of the quantized value of the envelope sample. Since the quantizer plus mapper can have a lookup table with different sets of $V_{dd}$ values, the $V_{dd}$ applied to the set of $N_{bq}$ amplifiers can change over time for different information blocks according to a slow power control that adapts the transmitted power to channel conditions. Thus, the ET performed by the apparatus of the current application is performed by the quantizer at sample basis and changes on the samples do not necessarily change the set of supply voltage values $V_{dd}$ applied to the amplifiers, being possible to have fixed $V_{dd}$ along each data block. Moreover, we have a multi $V_{dd}$ configuration with multi amplifiers, where each $V_{dd}$ affects the corresponding amplifier characterized by a power output and sized differently from the other amplifiers in the set of $N_{bq}$ amplifiers.

Document [31] discloses an envelope tracking supply modulator for multiple PAs, where the envelope tracking supply modulator is configured to provide, for each of the multiple PAs, a separate supply voltage that is modulated based on the envelope of the respective RF input signal to the PA. In this configuration each of the modulated supply voltages is constructed from a DC component and an alternating current (AC) component, being the DC component for each modulated supply voltage generated by a main switching regulator that is shared by the multiple PAs, each one associated to a different information signal. The envelope tracking supply modulator is configured to provide, for each of the multiple PAs, a separate supply voltage that is modulated based on the envelope of the respective RF input signal to the PA. Each of the modulated supply voltages is constructed from a DC component and an AC component, being the DC component for each modulated supply voltage generated by a main switching regulator that is shared by the multiple PAs. By sharing the main switching regulator implementation complexity is reduced when compared with other implementations where multiple envelope tracking PAs are used, such as transmitters with multiple antennas, where each antenna may be driven by a separate envelope tracking PA. In these cases, each of the multiple envelope tracking PAs are traditionally implemented independently of each other without any sharing of components between them, which can lead to higher component counts, larger die and/or board area, and increased monetary costs.

Contrarily to the embodiments disclosed by [31] the multi digital $V_{dd}$ apparatus disclosed in the present application implements a multi $V_{dd}$ scheme in a sense that we have a set of $N_{bq}$ different $V_{dd}$ individually applied to each amplifier in the set of $N_{bq}$ amplifiers, in which the $V_{dd}$ values are not independent, since the envelope amplified version is the result of the sum of all amplifiers outputs. A digital mapper with a quantizer with $N_{bq}$ bits, quantizes the envelope and decomposes the quantized values into components with constant amplitude. Changes on envelope are tracked by changing the phases of the components that are amplified and posteriorly combined. Another key difference lies on the fact that each $V_{dd}$ applied to each amplifier can stay fixed over an information block, being changed only the phases of the amplified signals over the different samples. Therefore, each amplifier can operate with a fixed operation point near compression point, and the design and size of each amplifier can be optimized for a specific output power that change for each amplification branch. This is possible since the tracking of the envelope is done by the digital mapper composed by a quantizer and mapper that select the set of supply voltage values $V_{dd}$ to be applied to the amplifiers during the duration of each information block and the phases that may change with the quantized of the sampled value. The quantizer of the digital mapper also provides the control information for a set of $N_{bq}$ different $V_{dd}$ values that should control $N_{bq}$ amplifiers in parallel and the delays needed to implement the different phases of the components. Therefore, the $V_{dd}$ of each amplifier does not change dynamically according the sample value of the envelope in each instant. Besides that, the digital mapper can change the $V_{dd}$ by choosing another set in a lookup table according to the information provided by a slow power control that adapts the transmitted power to channel conditions. This means that the different sets of $V_{dd}$ can be chosen over the time in a lookup table and applied to the set of $N_{bq}$ amplifiers. Thus, the ET performed by the apparatus can be viewed as the result of the combination of several amplifiers outputs, with fixed $V_{dd}$ along each block. This means that we have a multi $V_{dd}$ configuration but where different $V_{dd}$ values affect different amplifiers with distinct power outputs, which is not the case of the apparatus disclosed in [31].

Document [32] discloses an ET system with a new behavioral model with improved performance in modeling and linearization technique for ET PA. The proposed model uses a Memory Polynomial (MP) model with fixed supply voltage PAs as a prototype and modulates the coefficients along with the envelope signal which controls the supply voltage of the ET PA. Also, the proposed new model can be adopted in digital predistortion technique applied in ET PA system. Again, no relation exists between the ET disclosed by [32] and the apparatus of the current application.

Document [33] also discloses an envelope tracking technique, where it is employed a 1.5 bit (3-level) envelope amplifier to improve the overall efficiency of wideband high linearity envelope tracking power amplifiers. To enhance performance the authors, propose an envelope amplifier incorporating the multi-level quantizer for the switching stage. To reduce the switching noise power, it is adopted an envelope amplifier using a multi-level switching stage that allows a reduction on the ripple current in the same switching frequency. Efficiency has improved since the switching frequency is somewhat lower causing a reduction of the power loss in the switching stage and due to the smaller quantization error, that allows the linear stage to reduce the power consumption.

One main difference of the apparatus disclosed in the present application lies on the fact that ET is replaced by an envelope quantization (EQ) of the envelope samples that defines a set of $N_{bq}$ $V_{dd}$ values to be employed in $N_{bq}$ amplifiers in parallel with different power outputs. The quantizer provides also control information to configure the phases (delays) of in-phase and quadrature signal components in which the quantized envelope is decomposed, that are amplified by the set of $N_{bq}$ amplifiers with different $V_{dd}$. In the current application there is no need to switch the $V_{dd}$ value at the same rate of the sampling frequency, since the set of $V_{dd}$ values can remain unchanged over an entire data block. A slow power control can be applied to change the set of $V_{dd}$ between successive data blocks. Besides that, fast switching is needed only if it is employed a fast power control within the duration of each block. However, even in this case only the two most high $V_{dd}$ values need to change for 10% of the quantized samples. This also means that the complexity of the supply modulator is reduced, since the $V_{dd}$ vales are constant or almost constant over the time for each amplifier in the multi amplifier stage.

In document [12] it is disclosed a power amplifier system design based on wide-bandwidth envelope tracking (WBET) suitable for OFDM wireless local area network systems. Special focus is given to the development of an adaptive time-alignment algorithm for time alignment between the envelope and the RF paths in order to minimize the distortion and EVM that compromise performance of both EER and WBET. Due to the nonlinear behavior of WBET amplifier, a predistortion is also implemented in the proposed system, to compensate distortion caused by the time mismatch and the resulting nonlinear limiting behavior.

Documents [34] and [35] also disclose ET systems and methods to improve the supply modulator. In [34] it is disclosed an analysis of an ET PA that characterizes the operational behavior and identify the optimum ET operation point. For that purpose, the PA was modeled by sweeping the input power and supply voltage. A power control strategy was also presented for the optimal ET operation over a broad output power range. The effect of the delay mismatch on the characteristics of the ET PA was also described to assist the time alignment algorithm. Since the supply voltage of the RF PA is modulated by the supply modulator, the overall efficiency of the ET PA is proportional to the efficiency of the supply modulator. Therefore, the supply modulator is optimally designed to have a high efficiency without generating significant distortion. To achieve high efficiency and wideband operation, the supply modulator has been researched based on the hybrid switching structure. Document [36] discloses an ET system digitally controlled by a Digital Self-Oscillating Modulator (DiSOM) suitable for a high bandwidth digitally controlled envelope tracking power supply. The main advantage of the DiSOM is that it allows higher sampling frequencies in a digital control scheme for a DC-DC converter than the traditional counter base Digital PWM (DPWM) modulator. The DiSOM is characterized by being a purely digital modulator that receives a duty cycle command from an external source, typically the digital compensator calculates the required duty cycle to adjust the output voltage to the reference setpoint. Thus, power consumption of the RF PA is reduced by adapting the supply voltage of the RF PA to the RF output amplitude. The baseband processor and modulator block generate the RF input for RF PA and the RF envelope signal, which is used as a reference for the tracking power supply. The tracking power supply is, in this case, digitally controlled. The proposed DiSOM includes one or more control loops that include the switching output in the control loop, and it has no free running counter to set the switching frequency. Contrarily to what is referred in these two documents, in the apparatus of the current application, there is no need to change the supply of each amplifier, since changes on the quantized envelope are reflected in the phases of the components that are amplified in the $N_{bq}$ branches, being the sum of the amplifiers outputs equal to the amplified version of the quantized envelope. Also, time alignment requirements are loose, since no feedback is needed in the multi $V_{dd}$ digitally controlled multi amplifier stage disclosed in present application.

INFORMATION DISCLOSURE STATEMENTS

Patents and publications relevant to the patentability of the instant claims, concerning a multi quantized digitally controlled power supply voltage for multi amplifier stages.
[1] K. Bulusu, H. Shaiek, D. Roviras, R. Zayani, M. Renfors, L. Anttila, and M. Abdelaziz. "Power amplifier effects and peak-to-average power mitigation" in Orthogonal Waveforms and Filter Banks for Future Communication Systems, 1st ed., M. Renfors, X. Mestre, E. Kofidis, and F. Bader, Ed. Orlando, Fla., USA: Academic Press, Inc., 2017, pp. 461-489.

[2] S. C. Cripps. *RF Power Amplifiers for Wireless Communications.* 2nd ed., Norwood, Mass. USA: Artech House, Inc., 2006.

[3] R. V. Nee and R. Prasad. *OFDM for Wireless Multimedia Communications.* 1st ed., Norwood, Mass., USA: Artech House, Inc., 2000.

[4] H. H. Chen, The next generation of CDMA Technologies, John Wiley & Sons, 2007.

[5] D. Falconer, S. Ariyavisitakul, A. Benyamin-Seeyar, and B. Eidson, "Frequency domain equalization for single-carrier broadband wireless systems," *IEEE Commun. Mag.*, vol. 4, no. 4, pp. 58-66, Apr. 2002.

[6] L. Zhang, L.-L. Kuang, Z.-Y. Ni, and J.-H. Lu, "Performance evaluation for OFDM and SC-FDE systems with high power amplifier," in *Proc. IET Int. Commun. Conf. Wireless Mobile Comput. (CCWMC)*, December 2009, pp. 348-352.

[7] R. Wolf, F. Ellinger, and R. Eickhoff, "On the maximum efficiency of power amplifiers in OFDM broadcast systems with envelope following," in *Proc. Int. Conf. Mobile Lightw. Wireless Syst. (MobiLight)*, May 2010, pp. 160-170.

[8] O. Abel Gouba and Y. Louet, "Theoretical analysis of the trade-off between efficiency and linearity of the high power amplifier in OFDM context," in *Proc. Eur. Wireless Conf.*, April 2012, pp. 1-7.

[9] L. M. Correia, D. Zeller, O. Blume, D. Ferling, Y. Jading, I. Gódor, G. Auer, and L. V. D. Perre, "Challenges and enabling technologies for energy aware mobile radio networks," *IEEE Commun. Mag.*, vol. 48, pp. 66-72, November 2010.

[10] C.-T. Chen, Y.-C. Lin, T.-S. Horng, K.-C. Peng, and C.-J. Li, "Kahn envelope elimination and restoration technique using injection-locked oscillators," in *IEEE MTT-S Int. Microw. Symp. Dig.*, June 2012, pp. 1-4.

[11] F. Wang, D. Kimball, J. Popp, A. Yang, D. Y. C. Lie, P. Asbeck, and L. Larson, "Wideband envelope elimination and restoration power amplifier with high efficiency wideband envelope amplifier for WLAN 802.11g applications," in *IEEE MTT-S Int. Microw. Symp. Dig.*, June. 2005, pp. 645-648.

[12] F. Wang, A. Yang, D. Kimball, L. Larson, and P. Asbeck, "Design of wide-bandwidth envelope-tracking power amplifiers for OFDM applications," *IEEE Trans. Microw. Theory Tech.*, vol. 53, no. 4, pp. 1244-1255, April 2005.

[13] A. Zhu, P. J. Draxler, J. J. Yan, T. J. Brazil, D. F. Kimball, and P. M. Asbeck, "Open-loop digital predistorter for RF power amplifiers using dynamic deviation reduction-based Volterra series," *IEEE Trans. Microw. Theory Tech.*, vol. 56, no. 7, pp. 1524-1534, July 2008.

[14] L. Ding, G. T. Zhou, D. R. Morgan, Ma Zhengxiang, J. S. Kenney, K. Jaehyeong, and C. R. Giardina, "A robust digital baseband predistorter constructed using memory polynomials," *IEEE Trans. Commun.*, vol. 52, no. 1, pp. 159-165, January 2004.

[15] W. H. Doherty, "A new high-efficiency power amplifier for modulated waves," *Bell Syst. Tech. J.*, vol. 15, no. 3, pp. 469-475, July 1936.

[16] D. Gustafsson, J. C. Cahuana, D. Kuylenstierna, I. Angelov, and C. Fager, "A GaN MMIC modified Doherty PA with large bandwidth and reconfigurable efficiency," *IEEE Trans. Microw. Theory Tech.*, vol. 62, no. 12, pp. 3006-3016, December 2014.

[17] F. Giannini, P. Colantonio, and R. Giofré, "The Doherty amplifier: Past, present & future", in *Proc. IEEE Integr. Nonlinear Microw. and Millimetre-wave Circuits Workshop (INMMiC)*, October 2015, pp. 1-6.

[18] D. Cox, "Linear amplification with nonlinear components," *IEEE Trans. Commun.*, vol. 22, no. 12, pp. 1942-1945, December 1974.

[19] T. W. Barton and D. J. Perreault, "Theory and implementation of RF-input outphasing power amplification," *IEEE Trans. Microw. Theory Tech.*, vol. 63, no. 12, pp. 4273-4283, December 2015.

[20] D. Cox, "Linear amplification with nonlinear devices," Patent No.: U.S. Pat. No. 3,777,275A, Dec. 4, 1973.

[21] D. C. Cox, R. E. Langseth, D. O. J. Reudink, A. J. Rustako Jr, "Linear amplification using nonlinear devices and inverse sine phase modulation," Patent No.: U.S. Pat. No. 3,927,379A, Dec. 16, 1975.

[22] S. Byun, K. Kim, K. Lim, C.-Ho Lee, H. Kim, J. Laskar, "Digital linear amplification with nonlinear components (LINC) transmitter," Patent No.: U.S. Pat. No. 7,889,811B2, Feb. 15, 2011.

[23] B. Blumer, "Linear amplification with nonlinear components (LINC) modulator and method for generating out-phased signals for a LINC transmitter," Patent No.: U.S. Pat. No. 7,260,368B1, Aug. 21, 2007.

[24] D. Kim, D. Kang, J. Kim, Y. Cho, and B. Kim, "Wideband envelope tracking power amplifier for LTE application," in *Proc. IEEE Radio Freq. Integr. Circuits Symp. (RFIC)*, June 2012, pp. 275-278.

[25] Y. Li, J. Lopez, P.-H. Wu, W. Hu, R. Wu, and D. Y. C. Lie, "Design of high efficiency monolithic power amplifier with envelope-tracking and transistor resizing for broadband wireless applications," *IEEE J. Solid-State Circuits*, vol. 47, no. 9, pp. 2007-2018, September 2012.

[26] Z. Wang, "Demystifying envelope tracking: Use for high-efficiency power amplifiers for 4G and beyond," *IEEE Microw. Mag.*, vol. 16, no. 3, pp. 106-129, April 2015.

[27] Y. Li, J. Lopez, P.-H. Wu, W. Hu, R. Wu, and D. Y. C. Lie, "A SiGe envelope-tracking power amplifier with an integrated CMOS envelope modulator for mobile WiMAX/3GPP LTE transmitters," *IEEE Trans. Microw. Theory Techn.*, vol. 59, no. 10, pp. 2525-2536, October 2011.

[28] F. Wang, D. F. Kimball, D. Y. Lie, P. M. Asbeck, and L. E. Larson, "A monolithic high-efficiency 2.4-GHz 20-dBm SiGe BiCMOS envelope-tracking OFDM power amplifier," *IEEE J. Solid-State Circuits*, vol. 42, no. 6, pp. 1271-1281, June 2007.

[29] P. B. Kenington, "Integrated transceiver with envelope tracking," Patent No.: U.S. Pat. No. 7,715,811B2, May 11, 2010.

[30] E. Cohen, "Digital multi-level envelope tracking for wide-bandwidth signals," Patent No.: US943817262, Aug. 6, 2016.

[31] D. Rozenblit, T. Sowlati, A. Afsahi, D. Chowdhury, S. R. Mundlapudi, M. Vadipour, "Envelope tracking supply modulators for multiple power amplifiers," Patent No.: U.S. Pat. No. 9,614,477B1, Apr. 4, 2017.

[32] D. Li and H. Yu, "A new model for envelope tracking power amplifier modeling and digital predistortion," in *Proc. IEEE Int. Conf. Wireless Commun. Signal Process. (WCSP)*, October 2016, pp. 1-5.

[33] J. H. Kim, G. D. Jo, J. H. Oh, Y. H. Kim, K. C. Lee, and J. H. Jung, "3.54 GHz 10 W envelope tracking amplifier with 43% efficiency utilizing the 1.5 bit-high efficiency envelope amplifier," in *Proc. IEEE Topical Conf. Power Amplifiers for Wireless and Radio Appl.*, January 2011, pp. 21-24.

[35] J. Kim, D. Kim, Y. Cho, D. Kang, B. Park, K. Moon, and B. Kim, "Analysis of envelope-tracking power amplifier using mathematical modeling," *IEEE Trans. Microw. Theory Tech.*, vol. 62, no. 6, pp. 1352-1362, June 2014.

[36] L. T. Jakobsen and M. A. E. Andersen, "Digitally controlled envelope tracking power supply for an RF power amplifier," in *Proc. IEEE Int. Telecommunications Energy Conf.* (*INTELEC*), September 2007, pp. 636-642.

BRIEF SUMMARY OF THE INVENTION

In one embodiment, a time-varying envelope signal is sampled, quantized and decomposed into several constituent signals that are individually amplified, and then combined to form a desired amplified version of the quantized time-varying envelope. Amplitude, phase and/or frequency characteristics of one or more of the signals and supply voltage values $V_{dd}$ and current of one or more amplifiers are controlled to provide the desired amplitude, phase, frequency, and/or spectral characteristics of the desired amplified quantized version of the time-varying envelope signal.

In another embodiment, a time-varying envelope signal is decomposed into in-phase and quadrature components which are sampled, quantized and decomposed into several quasi constant or constant envelope constituent signals that are individually amplified and then combined to form a desired quantized version of the time-varying complex envelope signal. Amplitude, phase and/or frequency characteristics of one or more of the signals are controlled to provide the desired amplitude, phase, frequency, and/or spectral characteristics of the desired quantized version of the time-varying envelope signal.

In all embodiments the constituent signals are amplified, and then recombined to construct an amplified quantized version of the original time-varying envelope signal.

Embodiments of the invention can be practiced with modulated single carrier signals or modulated multi-carrier signals.

Embodiments of the invention can be implemented with analog and/or digital controls. The invention can be implemented with analog components or with a combination of analog components and digital components. Embodiments of the invention may be implemented as a digital circuit and with lookup tables. In modern radio transmission systems at least a part of the signal processing is usually performed digitally. Digital processing also offers some degree of flexibility for the implementation of the multi $V_{dd}$ digitally controlled system. Examples of digital circuits that may be used are field programmable gate arrays (FPGA), microprocessors or DSPs.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure and methods particularly pointed out in the written description and claims hereof as well as the appended drawings.

It is to be understood that both the foregoing summary and the following detailed description are exemplary and explanatory and are intended to provide further explanation of embodiments of the invention as claimed.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE FIGURES

The various aspects of embodiments of the present invention will be described with reference to the accompanying drawings, wherein generally similar reference numbers indicate identical or functionally similar elements. The various aspects of the embodiments disclosed here, including features and advantages of the present invention outlined above, are described more fully in the detailed description in conjunction with the drawings in which.

DETAILED DESCRIPTION OF THE INVENTION

Figure 1:
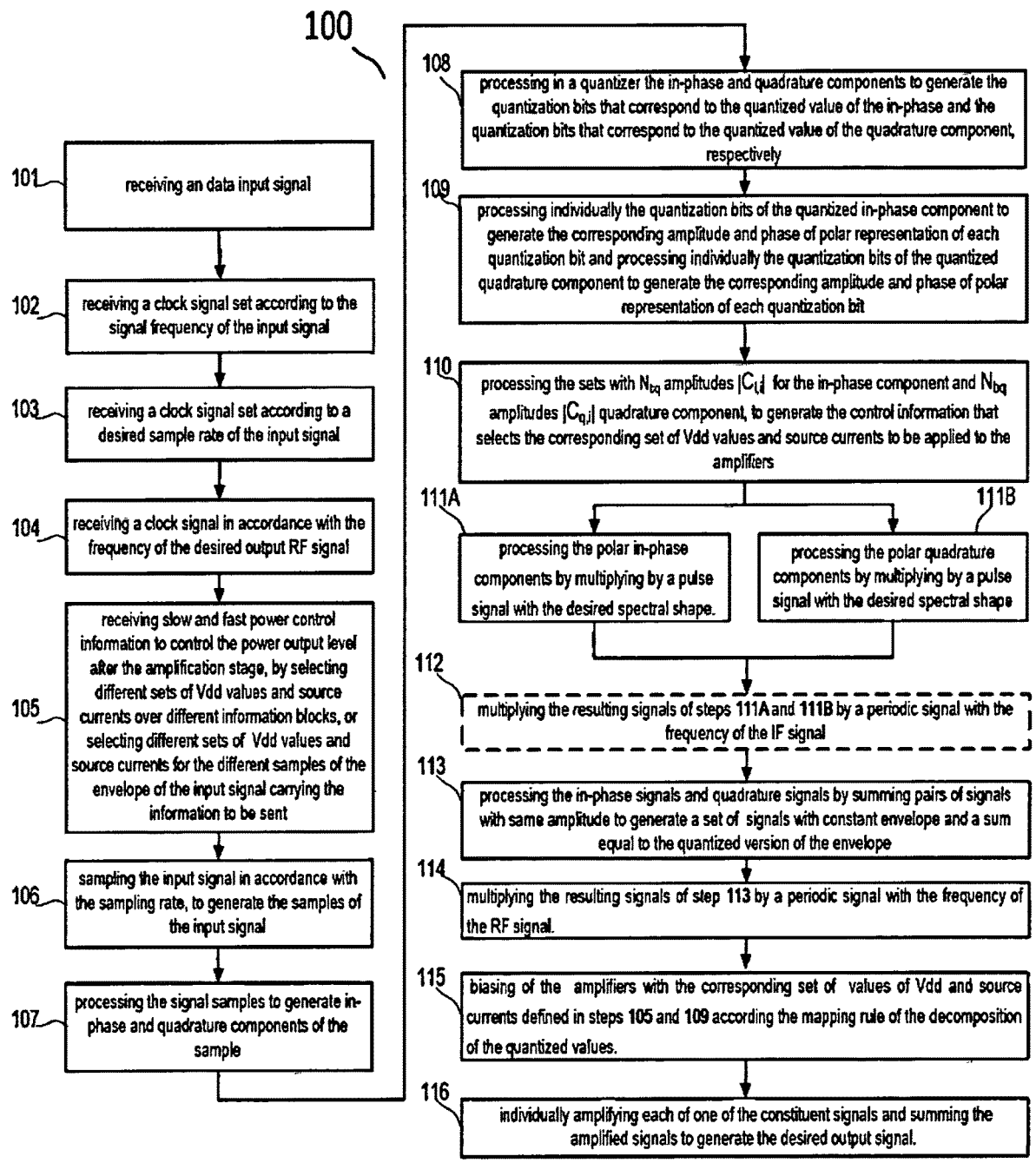
FIG. 1 is a process flowchart embodiment for multi quantized digitally controlled power supply voltage for multi amplifier stages method with current source amplifiers.

Table of Contents
1. Introduction
   1.1. Decomposition of time-varying envelope signals into constant envelope components
2. Multi Quantized Digitally Controlled Power Supply Voltage for Multi Amplifier Stages (MQDCPSVMAS) methods and systems
   2.1. Multi Quantized Digitally Controlled Power Supply Voltage for Multi Amplifier Stages with current source amplifiers
   2.2. Multi Quantized Digitally Controlled Power Supply Voltage for Multi Amplifier Stages with switched amplifiers
3. Multi amplifier amplification stage embodiments
4. Summary
5. Conclusions
1. Introduction Methods, apparatuses and systems for Multi Quantized Digitally Controlled Power Supply Voltage for Multi Amplifier Stages (MQDCPSVMAS) are disclosed herein. High-level description of MQDCPSVMAS methods and systems according to embodiments of the present invention will be provided in sections 2 and 3.

Some definitions are provided in this section only for convenience purposes and are not limiting. The meaning of these terms will be apparent for a person skilled in the art based on the entirety of the teachings provided herein.

Modulated signals can be described by $s(t)=s_I(t)\cos(\omega_c t)+js_Q(t)\sin(\omega_c t)$, where $\omega_c=2\pi f_c$ denotes the angular frequency, $f_c$ denotes the carrier frequency, and $s_I(t)$ and $s_Q(t)$ denote the in-phase and the quadrature component, respectively. The signal can be also described by $s(t)=\text{Re}\{\tilde{s}(t)e^{j\omega_c t}\}$, where $\tilde{s}(t)=s_I(t)+js_Q(t)$ denotes the complex envelope, $s_I(t)$ denotes the in phase component, $s_Q(t)$ denotes the quadrature component, with the signal envelope given by $e(t)=\sqrt{(s_I(t))^2+(S_Q(t))^2}$. When $e(t)$ is invariant along time the signal is said as constant envelope signal. Time varying envelope signal refers a signal where $e(t)$ varies with time. Having both non-constant envelope and phase, $s(t)$ is said to be a time-varying complex envelope signal. The dynamic range (DR) of the envelope represents the range of values between which the signal's envelope varies. The dynamic range of the in-phase component (DRi) represents the range of values between which the in-phase component varies. The dynamic range of the quadrature component (DRq) represents the range of values between which the quadrature component varies.

For purposes of convenience, and not limitation, time varying complex envelope signals are sometimes referred to herein as time varying envelope signals.

1.1 Decomposition of Time-Varying Envelope Signals into Constant Components

In a time varying envelope signal the envelope values may assume any value inside the dynamic range, being infinite the number of possible values. Through a quantization process the discretization of envelope could be done by restricting the possible values to a finite set of quantization values $\mathfrak{S}=\{s_0, s_1, \ldots, s_{N_{QL}-1}\}$, where $N_{QL}$ denotes the number of quantization levels, i.e. the size of the alphabet of quantization symbols. Let denote as $s(nT_s)=s_n$ the time domain sample of the time-varying envelope signal at the sample instant $nT_s$ and $s_I(nT_s)=s_{nI}$ and $s_Q(nT_s)=s_{nQ}$ the corresponding in-phase and quadrature components. Dynamic ranges of $(nT_s)=s_n$, $s_I(nT_s)=s_{nI}$ and $s_Q(nT_s)=s_{nQ}$ are DR, DRi and DRq respectively. For purposes of convenience, and not limitation it is assumed that DRi=DRq.

The quantizer transforms the time domain sample of the input signal $s_n$ into a quantized symbol $s_{n,QT}$ taken from a discrete alphabet of $N_{QL}=2^{N_{bq}}$ possible quantization symbols. The $N_{bq}$ quantization bits and $N_{QL}=2^{N_{bq}}$ quantization levels can be defined in terms of the maximum quantization error $$\varepsilon_Q = \frac{DR}{2\times 2^{N_b}} = \Delta,$$

where $2\Delta$ represents the quantization interval between two adjacent quantization symbols. The $N_{bq}$ quantization bits $(\beta_n^{(N_b-1)}, \beta_n^{(N_b-2)}, \ldots, \beta_n^{(1)}, \beta_n^{(0)})$ are employed in the definition of $N_m \leq N_{bp}$ polar components (i.e., $N_m$ phases and $N_m$ amplitudes) in which each quantization level can be decomposed. The bits $(\beta_n^{(N_{bq}-1)}, \beta_n^{(N_{bq}-2)}, \ldots, \beta_n^{(1)}, \beta_n^{(0)})$ are converted into polar form $(\beta_n^{(N_{bq}-1)}, \beta_n^{(N_{bq}-2)}, \ldots, b_n^{(1)}, b_n^{(0)})$ by $b_n^{(m)}=(-1)^{\beta_n^{(m)}}$. Each symbol from the finite set of quantizer values or symbols $\mathfrak{S}=\{s_0, s_1, \ldots, s_{N_{QL}-1}\}$, can be represented as a sum of $N_m \leq N_{bq}$ polar components, that are the result of the decomposition of quantization value $s_{n,QT}$ into polar components or complex components, which is given by:

$$\begin{aligned} s_{n,QT} &= c_0 + c_1 b_n^{(0)} + c_2 b_n^{(1)} + c_3 b_n^{(0)} b_n^{(1)} + c_4 b_n^{(2)} + \cdots \\ &= \sum_{i=0}^{N_m-1} c_i \prod_{m=0}^{N_m-1} (b_n^{(m)})^{\gamma_{m,i}} \\ &= \sum_{i=0}^{N_m-1} c_i b_n^{eq(i)}, \end{aligned}$$

with $(\gamma_{N_m-1,i}, \gamma_{N_m-2,i} \cdots \gamma_{1,i}, \gamma_{0,i})$ denoting the binary representation of i, $b_n^{(m)}=(-1)^{\beta_n^{(m)}}$ denoting the polar representation of the bit $\beta_n^{(m)}$, $b_n^{eq(i)}=\Pi_{m=0}^{N_m-1}(b_n^{(m)})^{\gamma_{m,i}}$ denoting the i'th polar component of $s_n$, and $N_m$ is the number of non-null complex coefficients $c_i$ of the referred decomposition equation above (the total number of coefficients is $2^{N_{bq}}$). For example, for $N_b=6$ and a symmetrical dynamic range DR (using as reference the zero value) the quantization levels are $\pm p\Delta+jk\Delta$, with p=1, 3, 5, 7 and k=1, 2, 3 5, 7 which can be given by $$s_{n,QT}=c_1 b_n^{(0)}+c_2 b_n^{(1)}+c_4 b_n^{(2)}+c_8 b_n^{(3)}+c_{16} b_n^{(4)}+c_{32} b_n^{(5)},$$

with $c_1=\Delta$, $c_2=j\Delta$, $c_4=j2\Delta$, $c_8=j2\Delta$, $c_{16}=4\Delta$, $c_{32}=j4\Delta$ and $c_i=0$, for $\forall i \neq 1, 2, 4, 8, 16, 32$.

Also, the quantization could be done by two quantizers, each one employed to quantize the in-phase and the quadrature component separately. Thus, the time domain sample of the complex envelope in-phase component $s_{nI}$ can be transformed into a quantized symbol $S_{nI,QT}$ taken from a finite alphabet of $2^{N_{bq}}$ possible quantization symbols. Also, the time domain sample of the quadrature component $s_{nQ}$ can be transformed into a quantized symbol $S_{nQ,QT}$ taken from a finite alphabet of $2^{N_{bq}}$ possible quantization symbols. The $N_{bq}$ quantization bits and $N_{QL}=2^{N_{bq}}$ quantization levels applied in each component can be defined in terms of the maximum quantization errors $$\varepsilon_{Qi} = \frac{DRi}{2 \times 2^{N_{bq}}} = \frac{2\Delta i}{2} \text{ and } \varepsilon_{Qq} = \frac{DRq}{2 \times 2^{N_{bq}}} = \frac{2\Delta q}{2}$$

where $2\Delta i$ and $2\Delta q$ represent the quantization interval for the in-phase component and quadrature component, respectively. For each component, $N_{bq}$ quantization bits ($\beta_{nI}^{(N_{bq}-1)}$, $\beta_{nI}^{(N_{bq}-2)}$, ..., $\beta_{nI}^{(1)}$, $\beta_{nI}^{(0)}$) and ($\beta_{nq}^{(N_{bq}-1)}$, $\beta_{nq}^{(N_{bq}-2)}$, ..., $\beta_{nq}^{(1)}$, $\beta_{nq}^{(0)}$) are employed in the definition of $N_m \leq N_{bq}$ polar components (i.e., $N_m$ phases and $N_m$ amplitudes) in which each quantization level can be decomposed. Both set of bits ($\beta_{nI}^{(N_b-1)}$, $\beta_{nI}^{(N_b-2)}$, ..., $\beta_{nI}^{(1)}$, $\beta_{nI}^{(0)}$) and ($\beta_{nq}^{(N_{bq}-1)}$, $\beta_{nq}^{(N_{bq}-2)}$, ..., $\beta_{nq}^{(1)}$, $\beta_{nq}^{(0)}$) are converted into polar forms ($b_{nI}^{(N_{bq}-1)}$, $b_{nI}^{(N_{bq}-2)}$, ..., $b_{nI}^{(1)}$, $b_{nI}^{(0)}$) by $b_{nI}^{(m)} = (-1)\beta_{nI}^{(m)}$ and $b_{nq}^{(m)} = (-1)\beta_{nq}^{(m)}$.

Each in-phase symbol from the finite set of symbols $\in I = \{s_{I,0}, s_{I,1}, \ldots, s_{I,N_{QL}-1}\}$ can be represented as a sum of $N_{mI} \leq N_{bq}$ polar components that are the result of the decomposition of quantization value $s_{nI,QT}$ into polar components given by $$s_{nI,QT} = c_{I,0} + c_{I,1}b_{nI}^{(0)} + c_{I,2}b_{nI}^{(1)} + c_{I,3}b_{nI}^{(0)}b_{nI}^{(1)} + c_{I,4}b_{nI}^{(2)} + \cdots$$
$$= \sum_{i=0}^{N_{mI}-1} c_{I,i} \prod_{m=0}^{N_{mI}-1} (b_{nI}^{(m)})^{\gamma_{m,i}},$$

with ($\gamma_{N_{mI}-1,i}$ $\gamma_{N_{mI}-2,i}$ ... $\gamma_{1,i}$, $\gamma_{0,i}$) denoting the binary representation of i, and $N_{mI}$ is the number of non-null $c_i$ real coefficients of the referred decomposition (the total number of coefficients is $2^{N_{bq}}-1$). For example, for $N_{bq}=3$ and a symmetrical dynamic range DRi (using as reference the zero value) the quantization levels are $\pm 7\Delta$, $\pm 5\Delta$, $\pm 3\Delta$, $+\Delta$, which can be given by $$s_{nI,QT} = c_{I,1}b_{nI}^{(0)} + c_{I,2}b_{nI}^{(1)} + c_{I,4}b_{nI}^{(2)},$$

with $c_{I,1}=\Delta$, $c_{I,2}=2\Delta$, $c_{I,4}=4\Delta$ and $c_{I,0}=c_{I,3}=c_{I,5}=c_{I,6}=c_{I,7}=0$. For the quadrature component each symbol from the finite set of quantizer symbols $\in Q = \{s_{q,0}, s_{q,1}, \ldots, s_{q,N_{QL}-1}\}$, can be represented as a sum of $N_{mQ} \leq N_{bq}$ polar components, that are the result of the decomposition of quantization value $S_{nq,QT}$ into polar components given by $$s_{nq,QT} = c_{q,0} + c_{q,1}b_{nq}^{(0)} + c_{q,2}b_{nq}^{(1)} + c_{q,3}b_{nq}^{(0)}b_{nq}^{(1)} + c_{q,4}b_{nq}^{(2)} + \cdots$$
$$= \sum_{i=0}^{N_{mQ}-1} c_{q,i} \prod_{m=0}^{N_{mQ}-1} (b_{nq}^{(m)})^{\gamma_{m,i}},$$

with ($\gamma_{N_{mQ}-1,i}$ $\gamma_{N_{mQ}-2,i}$ ... $\gamma_{1,i}$, $\gamma_{0,i}$) denoting the binary representation of i, and $N_{mQ}$ is the number of non-null $g_i$ real coefficients of the referred decomposition (the total number of coefficients is $2^{N_b}-1$). For example, for $N_b=3$ and a symmetrical dynamic range (using as reference the zero value) the quantization levels are $\pm j7\Delta$, $\pm j5\Delta$, $\pm j3\Delta$, $\pm j\Delta$, which can be given by $$s_{nq,QT} = c_{q,1}b_{nq}^{(0)} + c_{q,2}b_{nq}^{(1)} + c_{q,4}b_{nq}^{(2)},$$

with $c_{q,1}=j\Delta$, $c_{q,2}=j2\Delta$, $c_{q,4}=j4\Delta$ and $c_{q,0}=c_{q,3}=c_{q,5}=c_{q,6}=c_{q,7}=0$.

By a proper selection of the pulse shape to be applied to the polar components and time shifts between in-phase and quadrature it is possible to decompose the quantized envelope as a sum of constant envelope components. Since each component is amplified by an amplifier the signal resulting from the combination of all outputs could be given by $s_{n,QT,out} = \sum_{i=0}^{N_m-1} p_i$, where $p_i$ denotes the output power at i'th branch. For class A, and AB amplifiers we have $p_i = f(V_{dd}, V_{in}, I_{in})$. For class D amplifiers $p_i = f(V_{dd})$. In such conditions, to obtain the amplified version of the quantized envelope in class A or AB, the quantizer needs to provide the set with $N_{bq}$ values of $V_{dd}$ to be employed in the amplifiers plus the mapping rule (amplitude and phase) for the components. In class D, all the components may have the same amplitude, being necessary the $N_{bq}$ phases and the set of $N_{bq}$ $V_{dd}$ values.

The example above refers the case of quantized samples taken from time variant envelope signals. A person skilled in the art, however, will understand that by quantizing the envelope values of any time-variant envelope signal, and decomposing in a plurality of quasi or constant envelope signals, any amplified version of the time-variant quantized version of the envelope signal can be generated as a sum of the amplified constant envelope signals.

2. Multi Quantized Digitally Controlled Power Supply Voltage for Multi Amplifier Stages Methods and Systems MQDCPSVMAS methods and systems according to embodiments of the present invention rely on the ability to quantize and decompose any quantized time-varying envelope signal into several substantially constant envelope constituent signals or to generate such constituent signals, amplify the constituent signals, and then sum the amplified signals to generate an amplified version of the time-varying envelope signal.

In sections 2.1-2.2, embodiments of the present invention are provided, including $N_{bq}$ amplification branch embodiments with all supply voltage values $V_{dd}$ of all branches fixed over each information block or varying over the information block duration according to the control information provided by the quantizer and fast and slow power control unit that defines the selection rule of the $V_{dd}$ sets between envelope samples and information blocks. In the following descriptions, each embodiment is first presented conceptually using a mathematical derivation of underlying concepts of the embodiment. Two embodiments of a method of operation of the MQDCPSVMAS are then presented, followed by various system level embodiments.

In all embodiments for purposes of convenience, and not limitation it is assumed same quantization rule for both in-phase and quadrature components of the envelope samples.

According to one embodiment of the invention, herein called MQDCPSVMAS with current source amplifiers (MQDCPSVMASCS) for ease of illustration and not limitation, a time varying envelope signal is decomposed into $N_{bq}$ pairs of in-phase and quadrature constituent components with different amplitudes and DRi=DRq. In each pair the in-phase and quadrature constituent components are combined to generate a constituent signal with constant envelope that is amplified individually by an amplifier configured with a $V_{dd}$ selected from a set of $N_{bq}$ values. These $N_{bq}$ outputs of the $N_{bq}$ amplifiers are then summed to construct an amplified version of the quantized time-varying envelope of the signal.

According to another embodiment of the invention, herein called MQDCPSVMAS with switched amplifiers (MQDCPSVMASSA) for ease of illustration and not limitation, a time varying envelope signal is decomposed into $N_{bq}$ pairs of in-phase and quadrature constituent components with same amplitude and DRi=DRq. In each pair, the in-phase and quadrature constituent components are amplified individually by an amplifier configured with a $V_{dd}$ selected from a set of $N_{bq}$ values, with the $V_{dd}$ defined as a function of coefficients $c_{I,i}$ and $c_{q,i}$ to assure different voltage outputs. The $N_{bq}$ signals at amplifiers outputs are then summed to construct an amplified version of the quantized time-varying envelope of the signal.

It is noted that one quantizer and $N_{bq}$ amplification branches are employed in these embodiments. It is also assumed DRi=DRq and the same number of quantization bits for in-phase and quadrature components for purposes of illustration, and not limitation. The scope of the invention covers the use of two quantizers, one quantizer for in-phase and another for quadrature component, as well as the use of other number of branches different than $N_{bq}$, DRi≠DRq, and sets of $V_{dd}$ values with sizes different than the number of quantization bits, and the implementation of such variations will be apparent to persons skilled in the art based on the teachings contained herein.

Accordingly, in the MQDCPSVMAS embodiments the time domain sample of the signal $s_n$ is transformed into a quantized symbol $s_{n,QT}$ taken from a finite alphabet of $2^{N_{bq}}$ complex quantization symbols. The $N_{bq}$ quantization bits and $N_{QL}=2^{N_{bq}}$ quantization levels can be defined in terms of the maximum quantization error $$\varepsilon_Q = \frac{DR}{2 \times 2^{N_b}} = \Delta,$$

where $2\Delta$ represents the quantization interval. The $N_b$ quantization ($\beta_n^{(N_{bq}-1)}$, $\beta_n^{(N_{bq}-2)}$, ..., $\beta_n^{(1)}$, $\beta_n^{(0)}$) bits are employed in the definition of $N_m \leq N_{bq}$ complex components in which each quantization level can be decomposed. The bits ($\beta_n^{(N_{bq}-1)}$, $\beta_n^{(N_{bq}-2)}$, ..., $\beta_n^{(1)}$, $\beta_n^{(0)}$) are converted into polar form ($b_n^{(N_{bq}-1)}$, $b_n^{(N_b-2)}$, ..., $b_n^{(1)}$, $b_n^{(0)}$) $b_n^{(m)}=(-1)^{\beta_n^{(m)}}$. The finite set of quantizer symbols $\mathsf{S}=\{s_0, s_1, \ldots, s_{N_{QL}-1}\}$, where $N_{QL}=2^{N_b}$ is the number of complex quantization levels. Each symbol from the finite set of quantizer complex alphabet $\mathsf{S}=\{s_0, s_1, \ldots, s_{N_{QL}-1}\}$, can be represented as a sum of $N_m \leq N_{bq}$ components, that are the result of the decomposition of quantization value $s_{n,QT}$ given by $$s_{n,QT} = c_0 + c_1 b_n^{(0)} + c_2 b_n^{(1)} + c_3 b_n^{(0)} b_n^{(1)} + c_4 b_n^{(2)} + \cdots$$
$$= \sum_{i=0}^{N_m-1} c_i \prod_{m=0}^{N_m-1} (b_n^{(m)})^{\gamma_{m,i}}$$
$$= \sum_{i=0}^{N_m-1} c_i b_n^{eq(i)},$$

Each one of the $N_m$ polar components with amplitude $c_i$ has the amplitude and phase information associated to the components in which the quantized envelope can be decomposed. Note that the polar complex components can be modulated by an offset modulation such as offset quadrature phase shift keying (OQPSK), minimum phase shift keying (MSK), Gaussian MSK (GMSK) or other offset signal with a pulse shape selected to achieve high spectral efficiency and constant envelope.

As referred previously, the complex quantizer can be replaced by two quantizers, with one associated to the in-phase component and the other applied to the quadrature component. Under these conditions each in-phase symbol from the finite set of symbols $\mathsf{S}I=\{s_{I,0}, s_{I,1}, \ldots, S_{I,N_{QL}-1}\}$, can be represented as a sum of $N_{mI} \leq N_{bq}$ polar components that are the result of the decomposition of quantization value $s_{nI,QT}$ into polar components given by $$s_{nI,QT} = \sum_{i=0}^{N_{mI}-1} c_{I,i} \prod_{m=0}^{N_{mI}-1} (b_{nI}^{(m)})^{\gamma_{m,i}},$$

with $(\gamma_{N_{mI}-1,i}, \gamma_{N_{mI}-2,i} \cdots \gamma_{1,i}, \gamma_{0,i})$ denoting the binary representation of i, and $N_{mI}$ is the number of non-null $c_{I,i}$ real coefficients of the referred decomposition (the total number of coefficients is $2^{N_{bq}}-1$). For the quadrature component results the decomposition of quantization value $S_{nq,QT}$ into polar components given by $$s_{nq,QT} = \sum_{i=0}^{N_{mQ}-1} c_{q,i} \prod_{m=0}^{N_{mQ}-1} (b_{nq}^{(m)})^{\gamma_{m,i}},$$

with $N_{mQ}$ the number of non null $c_{q,i}$ imaginary coefficients of the referred decomposition (the total number of coefficients is $2^{N_b}-1$. Thus, it is possible to write $$s_{n,QT}=s_{nI,QT}+s_{nq,QT}.$$

According to the MQDCPSVMASCS embodiment are employed current source amplifiers of class A in the $N_{bq}$ amplification branches, only for illustration purposes and not limitation. Let consider the input signal applied to the i'th amplifier given by $$v_{in,i}(t)=A_i \sin(2\pi f_{RF} t+\theta_i)*r(t),$$

where $A_i=f(c_{I,i}, c_{q,i})$, $f_{RF}$ denotes the RF frequency, $\theta_i=g(c_{I,i}, c_{q,i})$ represents the phase of input signal in the i'th amplification branch and r(t) denotes the impulsive response of a filter that performs the spectral shaping of the amplifier's input signal (operator*denotes the convolution). In a transconductance based linear amplifier, the output signal voltage, considering a load $R_L$, is approximately given by $$v_{RL,i}(t)=g_{m,i}v_{in,i}(t)r_0\|R_L,$$

where $g_m$ denotes the transconductance, $R_L$ represents the load and $r_0$ the output resistance of the active device. Through an optimization process it is possible to maximize the amplifier efficiency by setting the power supply voltage $V_{dd}$ $$2V_{dd,i}=g_{m,i}A_i r_0\|R_L=k_i A_i,$$

with $k_i$ denoting a constant factor.

Under these conditions the efficiency is maximized, and the output power is $P_{out,i} \propto V_{dd,i}^2$. It follows that an amplified version of the quantized envelope can be obtained by the combination of $N_{bq}$ output voltages $v_{R_L,i}(t)$. From the quantization process it is possible to generate the set of quantization bits, the $N_{bq}$ amplitudes of the quantization components amplitudes $A_i$ and the set with $N_{bq}$ phases $\theta_i$, related with the phase of the input signal applied to the $N_{bq}$ amplifiers and the $V_{dd}$ values that optimize the $N_{bq}$ amplifiers according the amplitude and phase of the input signal.

According to one embodiment of MQDCPSVMASSA, only for illustration purposes and not limitation, are employed switched amplifiers of class D in the $N_{bq}$ amplification branches. For a switched mode amplifier, as for the case of class D operation, the output voltage at the load at the fundamental can be translated by $$v_{out,i}(t) = \frac{V_{dd,i}}{R_L}\sin(2\pi f_{RF}t + \alpha_i + f(\theta_i)) * r(t),$$

where $V_{dd,i}$ is the supply voltage applied to the i'th amplifier, $\alpha_i$ is a phase shift due to delays in the amplifier circuit and $f(\theta_i)$ is a phase shift function of the phase of the input signal. Since the output voltage is independent of the voltage's amplitude of the input signal, each $V_{dd,i}$ element should be proportional by a factor $k_i$ to the corresponding amplitude $A_i$. Under these conditions the signal, that results from the combination of the $N_{bq}$ outputs voltages, is an amplified version by a factor K of the quantized value of the envelope of the input signal. Thus, the set of $N_{bq}$ values of $V_{dd}$, the sets of $N_{bq}$ phases $\theta_i$ and $N_{bq}$ $V_{dd}$ values proportional to the components amplitudes $A_i$, are sufficient to obtain the amplified version of the envelope and assure at same time the optimal operational conditions for each amplifier in the set of $N_{bq}$ amplifiers employed in the amplification stage.

2.1 Multi Quantized Digitally Controlled Power Supply Voltage for Multi Amplifier Stages with Current Source Amplifiers In MQDCPSVMASCS embodiment the in-phase and quadrature components are used to generate constituent signals with constant envelope that are individually amplified. In one embodiment the in-phase and quadrature components have different amplitudes and phases, according to the set of coefficients $c_{I,1}$ and $c_{q,i}$. In another embodiment the in-phase and quadrature components have same amplitude and different phases, being the quantized components combined to generate constituent signals with constant envelope that are individually amplified.

The operation of the MQDCPSVMASCS embodiment shall be described further with reference to the flowchart of FIG. 1. Optional components are illustrated with dashed lines. The process starts at step 101, which includes receiving the signal carrying the information, that will be amplified. In another embodiment this involves receiving the RF signal carrying the information. In another embodiment this involves receiving the signal carrying the information in the intermediate frequency (IF). In another embodiment this involves receiving the envelope samples of the signal carrying the information.

Step 102 includes receiving a clock signal set according to the signal frequency of the input signal.

Step 103 includes receiving a clock signal set according to a desired sample rate of the input signal. It is important to mention that, as understood by a person skilled in the art, the sampling rate may vary according to the bandwidth of the input signal and the desired time resolution of the sampling process.

Step 104 includes receiving a clock signal in accordance with the frequency of the desired output RF signal.

Step 105 includes receiving slow and fast power control information to control the power output level after the amplification stage, by selecting different sets of $V_{dd}$ values and amplifiers' source currents over different information blocks, or selecting different sets of $V_{dd}$ values and amplifiers' source currents for the different samples of the envelope of the input signal carrying the information to be sent.

Step 106 includes sampling the input signal in accordance with the sampling rate, to generate the samples of the input signal. In the embodiment example of FIG. 1, step 106 is implemented by a sampling circuit or a sample and hold (S/FI) circuit. In embodiments with multicarrier signals, step 106 can be implemented by a fast Fourier transform (FFT) with a higher time resolution to fulfill the sampling rate requirement.

Step 107 includes processing the signal samples to generate in-phase and quadrature components of the sample.

Step 108 includes processing in a quantizer with $N_{bq}$ quantization bits the in-phase and quadrature components to generate the quantization bits that correspond to the quantized value of the in-phase and the quantization bits that correspond to the quantized value of the quadrature component, respectively. As understood by a person skilled in the art based on the teaching herein, step 108 can be performed by a block using a single quantizer for both component samples or two quantizers, each one for each component. Also, as understood by a person skilled in the art based on the teaching herein, step 108 can be performed by a comparator and a LUT with the corresponding quantization bits of the quantized values.

Step 109 includes processing individually the quantization bits of the quantized in-phase component to generate the corresponding amplitude and phase of polar representation of each quantization bit and processing individually the quantization bits of the quantized quadrature component to generate the corresponding amplitude and phase of polar representation of each quantization bit. The amplitude associated to each quantization bit is defined according to the decomposition of the quantized value into polar components with amplitudes given by the sets with $N_{bq}$ amplitudes $|c_{I,i}|$ and $N_{bq}$ amplitudes $|c_{q,i}|$ for the in-phase and quadrature component, respectively. As understood by a person skilled in the art based on the teaching herein, step 108 can be performed by a comparator and a LUT with the corresponding amplitudes and phases of the quantization bits. It is important to note that in certain embodiments of the present invention steps 107 and 108 can be done once by a block that quantizes and generates directly the bits, the amplitudes of polar components and the phases for the in-phase and quadrature components.

Step 110 includes processing the sets with $N_{bq}$ amplitudes $|c_{I,i}|$ and $N_{bq}$ amplitudes $|c_{q,i}|$ for the in-phase and quadrature component, to generate the control information that selects the corresponding set of $N_{bq}$ values of $V_{dd}$ to be applied to the $N_{bq}$ amplifiers. As understood by a person skilled in the art based on the teaching herein, step 110 can be performed by a LUT with the corresponding $V_{dd}$ to be applied to the amplifiers. It is important to note that in certain embodiments of the present invention steps 107, 108, 109 and 110 can be done once by a block that quantizes and generates directly the bits, the amplitudes of polar components, the phases for the in-phase and quadrature components and the control information for selecting the corresponding $V_{dd}$ set.

Step 111A includes processing the polar in-phase components by multiplying by a pulse signal with the desired spectral shape.

Step 111B includes processing the polar quadrature components by multiplying by a pulse signal with the desired spectral shape.

Step 112 is optional and includes multiplying the resulting signals of steps 111A and 111B by a periodic signal with the frequency of the IF signal.

Step 113 includes processing the in-phase signals and quadrature signals by summing pairs of signals with same amplitude to generate a set of $N_{bq}$ signals with constant envelope and a sum equal to the quantized version of the envelope.

Step 114 includes multiplying the resulting signals of step 113 by a periodic signal with the frequency of the RF signal.

Step 115 includes the biasing of the $N_{bq}$ amplifiers with the corresponding set of $N_{bq}$ values of $V_{dd}$, defined in steps 105 and 109 according the mapping rule of the decomposition of the quantized values.

Step 116 includes individually amplifying each one of the constituent signals and summing the amplified signals to generate the desired output signal.

Figure 2A:
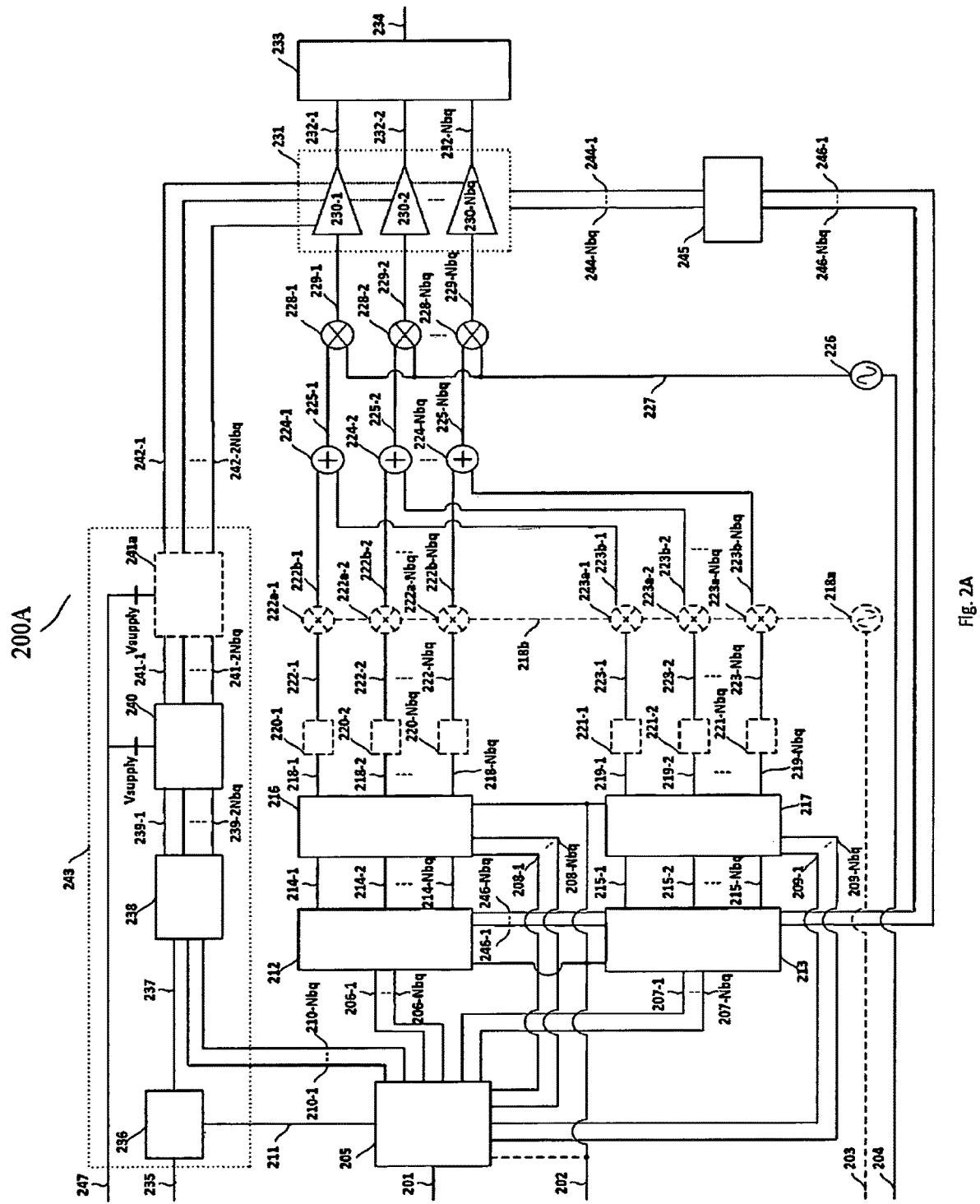
FIG. 2A is a block diagram that illustrates an exemplary embodiment of a multi quantized digitally controlled power supply voltage for multi amplifier stages apparatus for current source amplifiers without multiplying the polar quadrature components signals by a periodic signal in a intermediate frequency before being up-converted.
Figure 5:
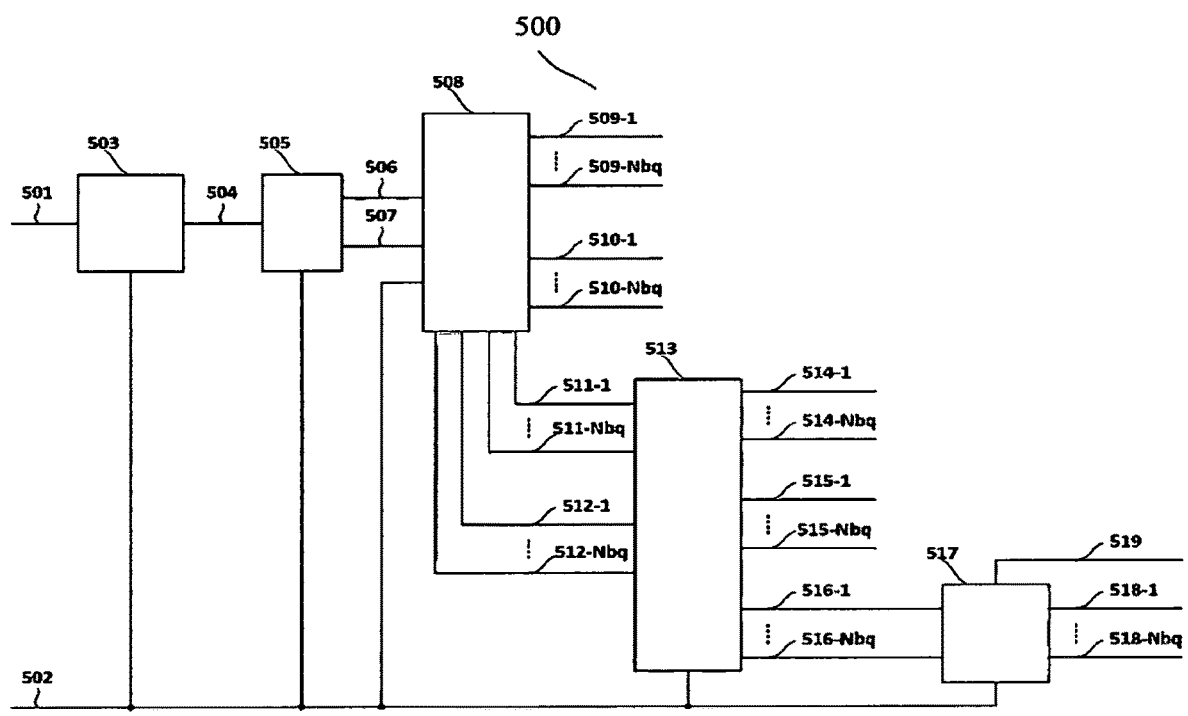
FIG. 5 is a block diagram that illustrates an exemplary embodiment for implementing the digital mapper employed in a multi quantized digitally controlled power supply voltage for multi amplifier stages.

Block diagram 200A of FIG. 2A is an example that illustrates an exemplary embodiment of the MQDCPSV-MASCS embodiment implementing the process flowchart 100 of FIG. 1, without the optional step 112. In the example of FIG. 2A, optional components are illustrated with dashed lines. In other embodiments, additional components may be optional. In this example, it is received a bandpass data signal with a time varying envelope 201, a clock reference signal 202 for the sampling process and a channel clock 204 with the desired frequency for the output signal, are received as inputs. In another embodiment the signal 201 can be the samples of a time-varying envelope signal and the S/H inside of the digital mapper 205 is not required. In other embodiments signal 201 can be a baseband signal, or IF signal. In FIG. 5 is illustrated an exemplary embodiment of the digital mapper 205.

The clock reference signal 202 can be used by the digital mapper 205, by the delay phases shifters polar converters blocks 212 and 213, and by the amplitude adjustment blocks 216 and 217. The common clock signal 202 is used to ensure that the outputs of quantizer 206-$\{1, \ldots, N_{bq}\}$ and 207-$\{1, \ldots, N_{bq}\}$ are time aligned, to ensure that the outputs of blocks 212 and 213 are time synchronized and the outputs of blocks 216 and 217 are also synchronized. It can be understood by a person skilled in the art that the choice of the clock reference signal is made according to the bandwidth of the input signal and the desired output signal.

In the digital mapper 205 the signal carrying the information is sampled according to a clock signal 202 and are generated the in-phase and quadrature components of each sample. Still referring to FIG. 2A, the in-phase and quadrature components of each sample are converted by the $N_{bq}$ bit quantizer of the digital mapper 205 into two sets of quantization bits signals 206-$\{1, \ldots, N_{bq}\}$ and 207-$\{1, \ldots, N_{bq}\}$, respectively. The quantization bits 206-$\{1, \ldots, N_{bq}\}$ and 207-$\{1, \ldots, N_{bq}\}$ are used by an internal mapper in 205, that can be a lookup table, to generate the signals 208-$\{1, \ldots, N_{bq}\}$ with the in-phase amplitude coefficients $|c_{I,i}|$ and the signals 209-$\{1, \ldots, N_{bq}\}$ with the quadrature amplitude coefficients $|c_{q,i}|$, that are used in amplitude adjustment blocks 216 and 217. In 205 a voltage mapper uses control information based on signals 208-$\{1, \ldots, N_{bq}\}$ and 209-$\{1, \ldots, N_{bq}\}$ to generate a set $N_{bq}$ control signals and 210-$\{1, \ldots, N_{bq}\}$ to select the set of $V_{dd}$ values in the lookup table 238. The set of $V_{dd}$ values is selected in 238 according to the control signal 210-$\{1, \ldots, N_{bq}\}$ and the control signal 237, provided by the fast/slow power control block 236. The digital mapper 205 also provides an optional control signal 211 to the fast/slow power control block 236, to be used in the selection of correct set of $V_{dd}$ values in 238. Fast/slow power control block 236 also receives a control signal 235 with information about the maximum output RF power required for transmission.

The signals 206-$\{1, \ldots, N_{bq}\}$ and 207-$\{1, \ldots, N_{bq}\}$ are provided to the delay phase shifters and polar converter blocks 212 and 213, to generate the phase rotations associated to each quantization bit and the corresponding polar representation and adjust the delays between the signals associated to the quantization bits. For illustration purposes and not limitation, for the quantization bits of the in-phase component 206-$\{1, \ldots, N_{bq}\}$, the bit 0 corresponds a phase of it and for the bit 1 a phase of 0. For the quantization bits of quadrature component 207-$\{1, \ldots, N_{bq}\}$, the bit 0 corresponds a phase of $-\pi/2$ and for the bit 1 a phase of $\pi/2$. The blocks 212 and 213 adjust the delays of the outputs signals 214-$\{1, \ldots, N_{bq}\}$ and 215-$\{1, \ldots, N_{bq}\}$ according the desired offset to be applied between the in-phase and quadrature signals 214-$\{1, \ldots, N_{bq}\}$ and 215-$\{1, \ldots, N_{bq}\}$ and the feedback information provided by the control signal 246-$\{1, \ldots, N_{bq}\}$ from the multi amplifier amplification stage 231.

In phase component signals 214-$\{1, \ldots, N_{bq}\}$ are provided to the block 216 that adjusts the amplitude of each signal according the signals 208-$\{1, \ldots, N_{bq}\}$ with the in-phase amplitude coefficients $|c_{I,i}|$ to generate the in-phase constituent signals 218-$\{1, \ldots, N_{bq}\}$. Also, the quadrature component signals 215-$\{1, \ldots, N_{bq}\}$ are provided to the block 217 that adjusts the amplitude of each signal according the signals 209-$\{1, \ldots, N_{bq}\}$ with the quadrature amplitude coefficients $|c_{q,i}|$ to generate the quadrature constituent signals 219-$\{1, \ldots, N_{bq}\}$. Both set of signals 218-$\{1, \ldots, N_{bq}\}$ and 219-$\{1, \ldots, N_{bq}\}$ could be submitted to a set of filters 220-$\{1, \ldots, N_{bq}\}$ and 221-$\{1, \ldots, N_{bq}\}$, with the same impulsive response, to assure the desired spectral shape.

The in-phase signals 222-$\{1, \ldots, N_{bq}\}$ are combined in 224-$\{1, \ldots, N_{bq}\}$ with the quadrature signals 223-$\{1, \ldots, N_{bq}\}$ to generate a set of constituent signals with quasi or constant envelope signals 225-$\{1, \ldots, N_{bq}\}$. Signals 225-$\{1, \ldots, N_{bq}\}$ are up converted to the RF frequency in 228-$\{1, \ldots, N_{bq}\}$ through a multiplication by a periodic signal 227 with the desired RF frequency defined by clock 204. The signals 229-$\{1, \ldots, N_{bq}\}$ with quasi or constant envelope are the inputs of the corresponding power amplifiers (PAs) 230-$\{1, \ldots, N_{bq}\}$ of the amplification stage. In another embodiment PAs 230-$\{1, \ldots, N_{bq}\}$ include power amplifiers of class A. In another embodiment PAs 230-$\{1, \ldots, N_{bq}\}$ include power amplifiers of class AB, B and C.

Each PA in the set of $N_{bq}$ amplifiers 231 has an unique $V_{dd}$ voltage value from the set of $V_{dd}$ values and their bias 242-$\{1, \ldots, 2N_{bq}\}$ applied to the amplification stage with $N_{bq}$ amplifiers 231. The $V_{dd}$ values 242-$\{1, \ldots, N_{bq}\}$ and their bias 242-$\{N_{bq}+1, \ldots, 2N_{bq}\}$, that are applied to the $N_{bq}$ amplifiers 230-$\{1, \ldots, N_{bq}\}$, are the output of the power and $V_{dd}$ control block 243 composed by the fast and slow power control block 236, the lookup table 238 that sends the control signals 239-$\{1, \ldots, 2N_{bq}\}$ to the DC/DC (Direct Current/Direct Current) converter 240 that define the set of $V_{dd}$ values 241-$\{1, \ldots, 2N_{bq}\}$ to be generated by the DC/DC converter. Block 241a is an optional low-dropout regulator (LDO). When block 241a is absent signals 241-$\{1, \ldots, 2N_{bq}\}$ and 242-$\{1, \ldots, 2N_{bq}\}$ are equal. The supply signal 247 is used by the DC/DC converter 240 (and by the optional LDO 241a) to generate the set of $V_{dd}$ values and bias signals, used in the amplification stage 231.

The outputs of PAs 232-$\{1, \ldots, N_{bq}\}$ are coupled together in a combiner 233 using well known combining techniques such as active combiners or other techniques such as Wilkinson, hybrid or transformers. Alternatively, the outputs of PAs 232-$\{1, \ldots, N_{bq}\}$ can be coupled through LC matching for a minimal power loss. Amplification stage embodiments according to power amplification methods and systems of the present invention will be further described in section 3.

The phase control circuit 245 is employed to generate feedback control signals 246-$\{1, \ldots, N_{bq}\}$ to blocks 212 and 213 to compensate phase mismatches among the amplifiers, based on the information signals 244-$\{1, \ldots, N_{bq}\}$.

Figure 2B:
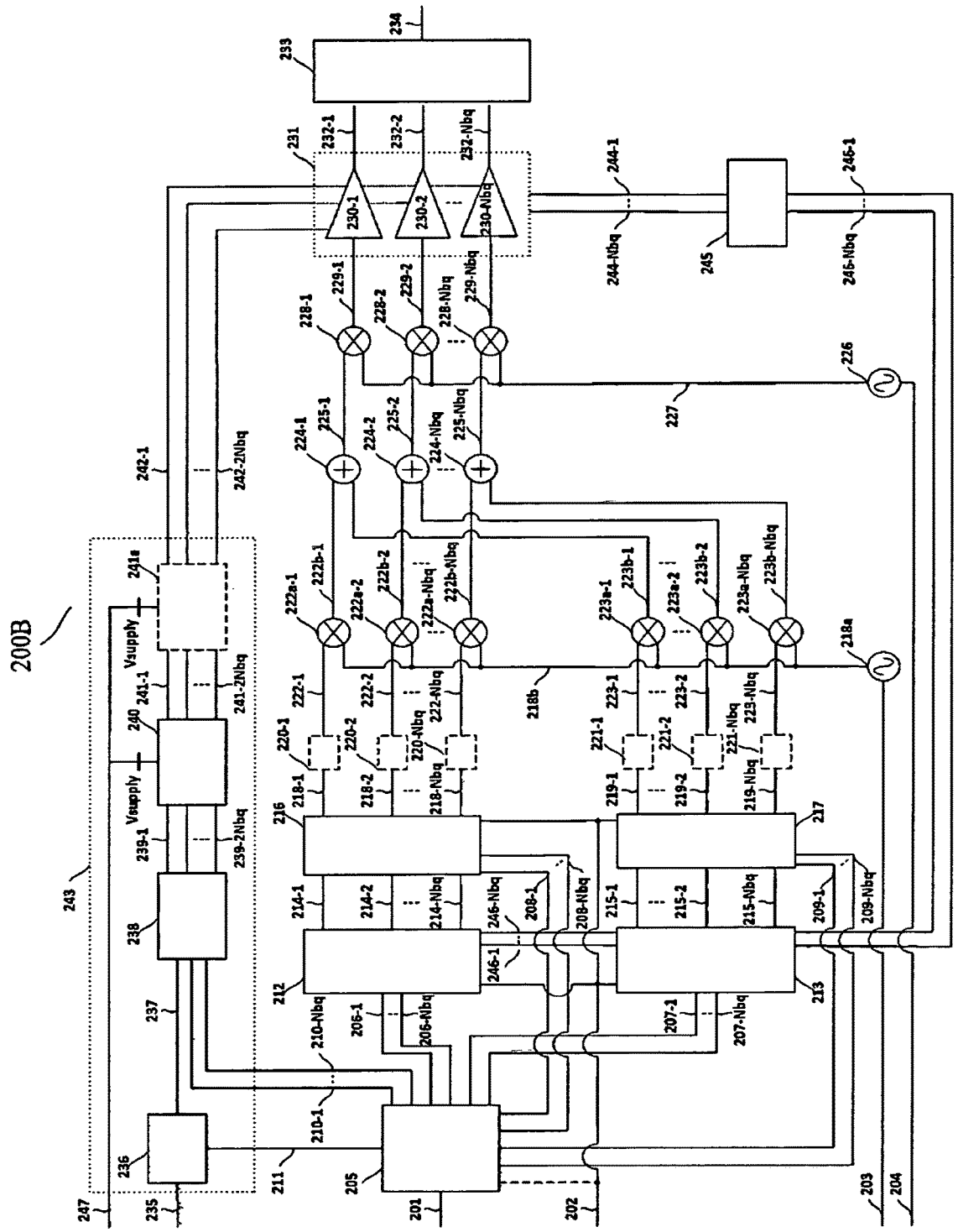
FIG. 2B is a block diagram that illustrates an exemplary embodiment of a multi quantized digitally controlled power supply voltage for multi amplifier stages apparatus for current source amplifiers where the resulting polar quadrature components signals are multiplied by a periodic signal in a intermediate frequency before being up-converted.

Block diagram 200B of FIG. 2B is an example that illustrates an exemplary embodiment of the MQDCPSV-MASCS embodiment implementing the process flowchart 100 of FIG. 1, with the optional step 112. In the example of FIG. 2B, optional components are illustrated with dashed lines. In other embodiments, additional components may be optional. In this example is received a bandpass data signal with time varying envelope 201, a clock reference signal 202 for the sampling process, an intermediate channel clock 203, with the desired intermediate frequency, and a RF channel clock 204, with the desired frequency for the output signal, are received as inputs. In another embodiment the signal 201 can be the samples of a time-varying envelope signal and the S/H inside of the digital mapper 205 is not required. In other embodiments signal 201 can be a baseband signal, or IF signal. In FIG. 5 is illustrated an exemplary embodiment of the digital mapper 205.

The clock reference signal 202 can be used by the digital mapper 205, by the delay phases shifters polar converters blocks 212 and 213, and by the amplitude adjustment blocks 216 and 217. The common clock signal 202 is used to ensure that the outputs of quantizer 206-$\{1, \ldots, N_{bq}\}$ and 207-$\{1, \ldots, N_{bq}\}$ are time aligned, to ensure that the outputs of blocks 212 and 213 are time synchronized and the outputs of blocks 216 and 217 are also synchronized. It can be understood by a person skilled in the art that the choice of the clock reference signal is made according to the bandwidth of the input signal and the desired output signal.

In the digital mapper 205 the signal carrying the information is sampled according to a clock signal 202 and are generated the in-phase and quadrature components of each sample. Still referring to FIG. 2B, the in-phase and quadrature components of each sample are converted by the $N_{bq}$ bit quantizer of the digital mapper 205 into two sets of quantization bits signals 206-$\{1, \ldots, N_{bq}\}$ and 207-$\{1, \ldots, N_{bq}\}$, respectively. The quantization bits 206-$\{1, \ldots, N_{bq}\}$ and 207-$\{1, \ldots, N_{bq}\}$ are used by an internal mapper in 205, that can be a lookup table, to generate the signals 208-$\{1, \ldots, N_{bq}\}$ with the in-phase amplitude coefficients $|c_{I,i}|$ and the signals 209-$\{1, \ldots, N_{bq}\}$ with the quadrature amplitude coefficients $|c_{I,i}|$, that are used in amplitude adjustment blocks 216 and 217. In 205 a voltage mapper uses the signals 208-$\{1, \ldots, N_{bq}\}$ and 209-$\{1, \ldots, N_{bq}\}$ to generate a set $N_{bq}$ control signals and 210-$\{1, \ldots, N_{bq}\}$ to select the set of $V_{dd}$ values in the lookup table 238. The set of $V_{dd}$ values is selected in 238 according the control signal 210-$\{1, \ldots, N_{bq}\}$ and the control signal 237 provided by the fast/slow power control block 236. The digital mapper 205 also provides an optional control signal 211 to the fast/slow power control block 236, to be used in the selection of correct set of $V_{dd}$ values in 238.

The signals 206-$\{1, \ldots, N_{bq}\}$ and 207-$\{1, \ldots, N_{bq}\}$ are provided to the delay phase shifters and polar converter blocks 212 and 213, to generate the phase rotations associated to each quantization bit and the corresponding polar representation and adjust the delays between the signals associated to the quantization bits. For illustration purposes and not limitation, for the quantization bits of the in-phase component 206-$\{1, \ldots, N_{bq}\}$, the bit 0 corresponds a phase of $\Pi$ and for the bit 1 a phase of 0. For the quantization bits of quadrature component 207-$\{1, \ldots, N_{bq}\}$, the bit 0 corresponds a phase of $-\pi/2$ and for the bit 1 a phase of $\pi/2$. The blocks 212 and 213 adjust the delays of the outputs signals 214-$\{1, \ldots, N_{bq}\}$ and 215-$\{1, \ldots, N_{bq}\}$ according the desired offset to be applied between the in-phase and quadrature signals 214-$\{1, \ldots, N_{bq}\}$ and 215-$\{1, \ldots, N_{bq}\}$ and the feedback information provided by the control signals 246-$\{1, \ldots, N_{bq}\}$ from the multi amplifier amplification stage 231.

In phase component signals 214-$\{1, \ldots, N_{bq}\}$ are provided to the block 216 that adjusts the amplitude of each signal according the signals 208-$\{1, \ldots, N_{bq}\}$ with the in-phase amplitude coefficients $|c_{I,i}|$ to generate the in-phase constituent signals 218-$\{1, \ldots, N_{bq}\}$. Also, the quadrature component signals 215-$\{1, \ldots, N_{bq}\}$ are provided to the block 217 that adjusts the amplitude of each signal according the signals 209-$\{1, \ldots, N_{bq}\}$ with the quadrature amplitude coefficients $|c_{I,i}|$ to generate the quadrature constituent signals 219-$\{1, \ldots, N_{bq}\}$. Both set of signals 218-$\{1, \ldots, N_{bq}\}$ and 219-$\{1, \ldots, N_{bq}\}$ could be submitted to a set of filters 220-$\{1, \ldots, N_{bq}\}$ and 221-$\{1, \ldots, N_{bq}\}$, with the same impulsive response, to assure the desired spectral shape.

In-phase signals 222b-$\{1, \ldots, N_{bq}\}$ in an intermediate frequency are obtained by multiplying in 222a-$\{1, \ldots, N_{bq}\}$ the signals 222-$\{1, \ldots, N_{bq}\}$ by a pulse periodic signal 218b with the desired intermediate frequency provided by the oscillator 218a according the reference signal 203. IF quadrature signals 223b-$\{1, \ldots, N_{bq}\}$ are obtained by multiplying in 223a-$\{1, \ldots, N_{bq}\}$ the signals 223-$\{1, \ldots, N_{bq}\}$ by the pulse periodic signal 218b. The in-phase signals 222b-$\{1, \ldots, N_{bq}\}$ are combined in 224-$\{1, \ldots, N_{bq}\}$ with the quadrature signals 223b-$\{1, \ldots, N_{bq}\}$ to generate a set of constituent signals with quasi or constant envelope signals 225-$\{1, \ldots, N_{bq}\}$. The signals 225-$\{1, \ldots, N_{bq}\}$ are up converted to the RF frequency in 228-$\{1, \ldots, N_{bq}\}$ through a multiplication by a periodic signal 227 generated by the oscillator 226 with the desired RF frequency defined by clock 204. The signals 229-$\{1, \ldots N_{bq}\}$ with quasi or constant envelope are the inputs of the corresponding PAs 230-$\{1, \ldots, N_{bq}\}$ of the amplification stage. In another embodiment PAs 230-$\{1, \ldots, N_{bq}\}$ include power amplifiers of class A. In another embodiment PAs 230-$\{1, \ldots, N_{bq}\}$ include power amplifiers of class AB, B and C.

Each PA in the set of $N_{bq}$ amplifiers 231 has an unique $V_{dd}$ voltage value from the set of $V_{dd}$ values and their bias 242-$\{1, \ldots, 2N_{bq}\}$ applied to the amplification stage with $N_{bq}$ amplifiers 231. The $V_{dd}$ values 242-$\{1, \ldots, N_{bq}\}$ and their bias 242-$\{N_{bq}+1, \ldots, 2N_{bq}\}$ that are applied to the $N_{bq}$ amplifiers 230-$\{1, \ldots, N_{bq}\}$, are the output of the power and $V_{dd}$ control block 243 composed by the fast and slow power control block 236, the lookup table 238 that sends the control signals 239-$\{1, \ldots, 2N_{bq}\}$ to the DC/DC converter 240 that define the set of $V_{dd}$ values 241-$\{1, \ldots, 2N_{bq}\}$ to be generated by the DC/DC converter. Block 241a is an optional LDO. When block 241a is absent signals 241-$\{1, \ldots, 2N_{bq}\}$ and 242-$\{1, \ldots, 2N_{bq}\}$ are equal. The supply signal 247 is used by the DC/DC converter 240 (and by the optional LDO 241a) to generate the set of $V_{dd}$ values and bias signals, used in the amplification stage 231.

The outputs of PAs 232-$\{1, \ldots, N_{bq}\}$ are coupled together in a combiner 233 using well known combining techniques such as active combiners or other techniques such as Wilkinson, hybrid or transformers. Alternatively, the outputs of PAs 232-$\{1, \ldots, N_{bq}\}$ can be coupled through LC matching for a minimal power loss. Amplification stage embodiments according to power amplification methods and systems of the present invention will further described in section 3.

In another embodiment a phase control circuit 245 could be employed to generate feedback control signals 246-$\{1, \ldots, N_{bq}\}$ to blocks 212 and 213 to compensate phase mismatches among amplifiers, based on the information signals 244-$\{1, \ldots, N_{bq}\}$.

2.2 Multi Quantized Digitally Controlled Power Supply Voltage for Multi Amplifier Stages with Switched Amplifiers According to the Multi Quantized Digitally Controlled Power Supply Voltage for Multi Amplifier Stages with Switched Amplifiers (MQDCPSVMASSA) embodiment of the invention, for ease of illustration and not limitation, a time-varying envelope signal is decomposed into $N_{bq}$ quasi or constant envelope constituent signals with same amplitude and different phase belonging to a discrete alphabet. The constituent signals are amplified individually, and then summed to obtain an amplified version of the quantized time-varying complex envelope signal. It is noted that one quantizer with $N_{bq}$ quantization bits and $N_{bq}$ amplification branches are employed in these embodiments for purposes of illustration, and not limitation. Each $V_{dd,i}$ in the set of $V_{dd}$ values has different values proportional the corresponding set of coefficients $c_{I,i}$ and $c_{q,i}$ that are constant over time and the in-phase and quadrature components have the same amplitude and different phases, being the amplified version of the quantized envelope the result of the sum of all amplifiers outputs. In other embodiments, several sets of supply voltage values $V_{dd}$ are available and the set may change between data blocks. In other embodiment, the $V_{dd}$ may change between samples. The scope of the invention covers the use of other numbers of branches, multiple sets of $V_{dd}$ and DRi=DRq and DRi≠DRq and implementation of such variations will be apparent to persons skilled in the art based on the teachings contained herein.

Figure 3:
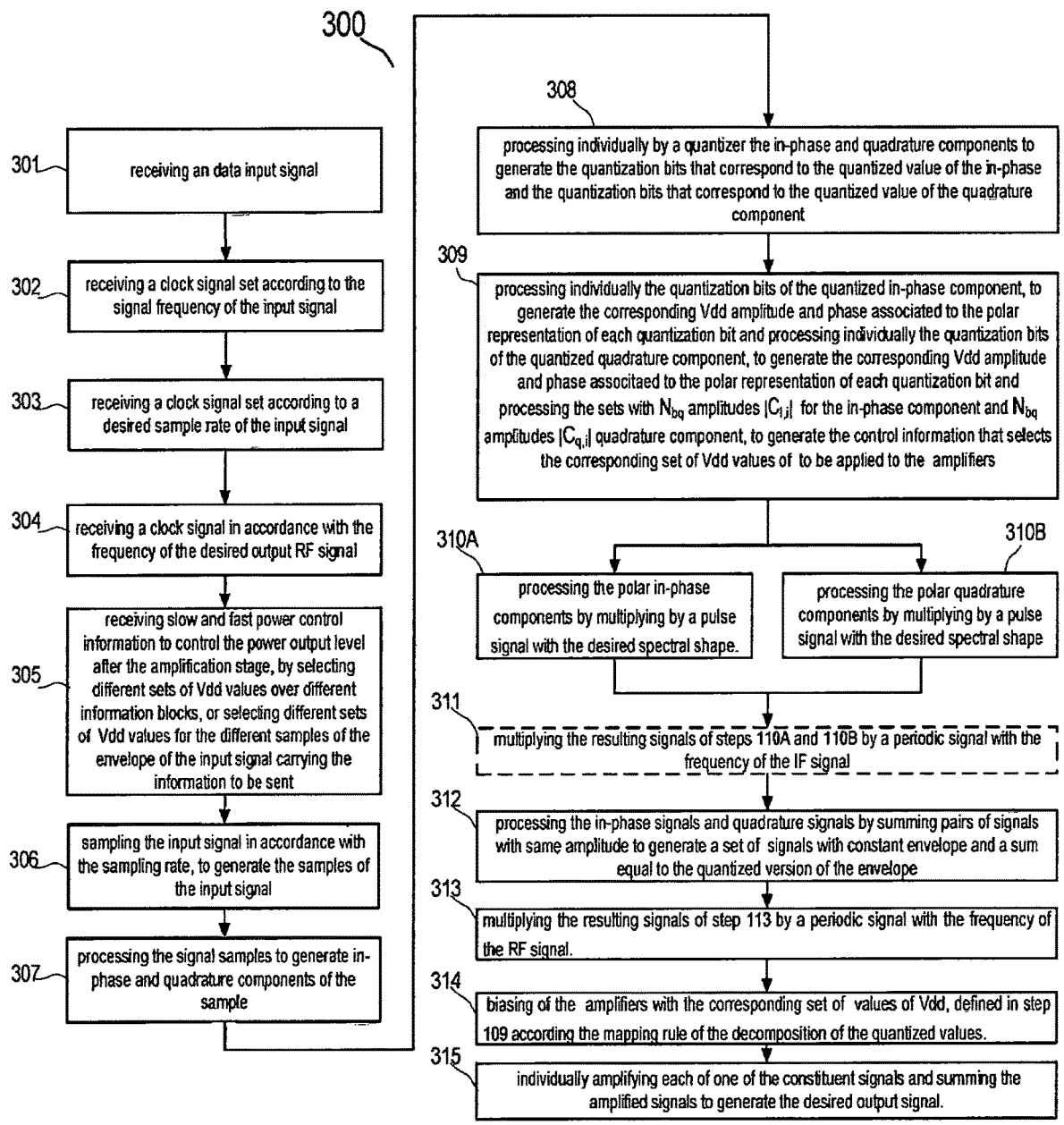
FIG. 3 is a process flowchart embodiment for multi quantized digitally controlled power supply voltage for multi amplifier stages method with switched amplifiers.

Operation of the MQDCPSVMASSA embodiments shall be described further with reference to the flowchart of FIG. 3. Optional steps are illustrated with dashed lines. The process starts at step 301, which includes receiving a time varying envelope bandpass signal. In another embodiment this involves receiving the desired input RF signal. In another embodiment, this involves receiving the desired IF signal. In another embodiment, this involves receiving a baseband signal. In another embodiment, this involves receiving the samples of the time varying envelope signal or receiving the samples the in-phase and quadrature components of a time varying envelope signal.

Step 302 includes receiving a clock signal set according to the signal frequency of the input signal.

Step 303 includes receiving a clock signal set according to a desired sample rate of the input signal. It is important to mention that, as understood by a person skilled in the art, the sampling rate may vary according to the bandwidth of the input signal and the desired time resolution of the sampling process.

Step 304 includes receiving a clock signal in accordance with the frequency of the desired output RF signal.

Step 305 includes receiving slow and fast power control information to control the power output level after the amplification stage by selecting different sets of $V_{dd}$ values over different information blocks or selecting different sets of $V_{dd}$ values for the different samples of the envelope of the input signal carrying the information to be sent.

Step 306 includes sampling the input signal in accordance with the sampling rate to generate the samples of the input signal. In the embodiment example of FIG. 3, step 306 is implemented by a sampling circuit or a sample and hold (S/H) circuit. In embodiments with multicarrier signals, step 306 can be implemented by a fast Fourier transform (FFT) with a higher time resolution to fulfill the sampling rate requirement.

Step 307 includes processing the signal to generate in-phase and quadrature components.

Step 308 includes processing individually by a quantizer the in-phase and quadrature components to generate the quantization bits that correspond to the quantized value of the in-phase and the quantization bits that correspond to the quantized value of the quadrature component, respectively. As understood by a person skilled in the art based on the teaching herein, step 308 can be performed by a block using a single quantizer. Also, as understood by a person skilled in the art based on the teaching herein, step 308 can be performed by a comparator and a LUT with the corresponding quantization bits of the quantized values.

Step 309 includes processing individually the quantization bits of the quantized in-phase component, to generate the corresponding $V_{dd}$ amplitude and phase associated to the polar representation of each quantization bit and processing individually the quantization bits of the quantized quadrature component to generate the corresponding $V_{dd}$ amplitude and phase associated to the polar representation of each quantization bit. The amplitude of each $V_{dd}$ associated to each component is obtained according to the decomposition of the quantized value into polar components with amplitudes given by the sets with $N_{bq}$ amplitudes $|c_{I,i}|$ and $N_{bq}$ amplitudes $|c_{q,i}|$ for the in-phase and quadrature component, respectively. As understood by a person skilled in the art based on the teaching herein, step 308 can be performed by a comparator and a LUT with the corresponding amplitudes and phases of each quantization bit. It is important to note that in certain embodiments of the present invention steps 307 and 308 can be done once by a block that quantizes and generates directly the bits, the $V_{dd}$'s amplitudes associated to each polar component and the phases for the in-phase and quadrature components.

Step 310A includes processing the polar in-phase components by multiplying by a pulse signal with the desired spectral shape.

Step 310B includes processing the polar quadrature components by multiplying by a pulse signal with the desired spectral shape.

Step 311 is optional and includes multiplying the resulting signals of steps 310A and 310B by a periodic signal with the frequency of the IF signal.

Step 312 includes processing the in-phase signals and quadrature signals by summing pairs of signals with same amplitude to generate a set of $N_{bq}$ signals with constant envelope and a sum equal to the quantized version of the envelope.

Step 313 includes multiplying the resulting signals of step 312 by a periodic signal with the frequency of the RF signal.

Step 314 includes the biasing of the $N_{bq}$ amplifiers with the corresponding set of $N_{bq}$ values of $V_{dd}$, defined in step 309 according to the mapping rule of the decomposition of the quantized values.

Step 315 includes individually amplifying each of one of the constituent signals and summing the amplified signals to generate the desired output signal.

Figure 4A:
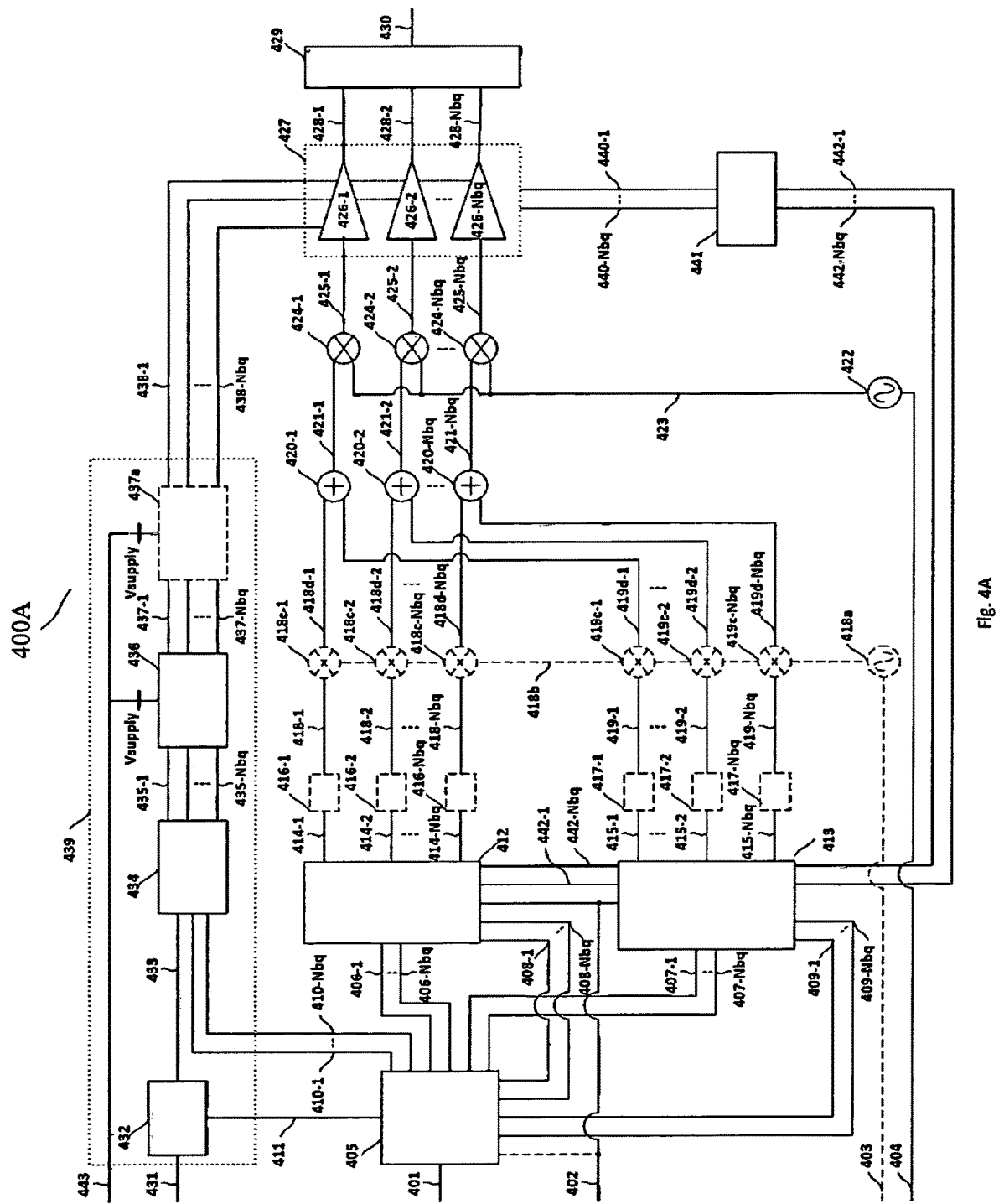
FIG. 4A is a block diagram that illustrates an exemplary embodiment of a multi quantized digitally controlled power supply voltage for multi amplifier stages apparatus for switched amplifiers without multiplying the polar quadrature components signals by a periodic signal in a intermediate frequency before being up-converted.

Block diagram 400A of FIG. 4A is an example that illustrates an embodiment of the MQDCPSVMASSA, implementing the process flowchart 300 of FIG. 3, without optional step 311. In the example of FIG. 4A, optional components are illustrated with dashed lines. In other embodiments, additional components may be optional.

In this example a time varying envelope signal 401, a clock reference signal 402 for the sampling process and a channel clock 404 with the desired frequency for the output signal are received as inputs. In another embodiment the signal 401 can be the samples of a time-varying envelope signal and the S/H inside of the digital mapper 405 is not required. In other embodiments signal 401 can be a baseband signal, or IF signal. In FIG. 5 is illustrated an exemplary embodiment of the digital mapper 405.

The clock reference signal 402 can be used by the digital mapper 405, by the delay phases shifters polar converters blocks 412 and 413. The common clock signal 402 is used to ensure that the outputs of quantizer 406-$\{1, \ldots, N_{bq}\}$ and 407-$\{1, \ldots, N_{bq}\}$ are time aligned and to ensure that the outputs of blocks 412 and 413 are synchronized. It can be understood by a person skilled in the art that the choice of the clock reference signal 402 is made according the bandwidth of the input signal and the desired output signal.

In the digital mapper 405 the signal carrying the information is sampled according to a clock signal 402 and are generated the in-phase and quadrature components of each sample. Still referring to FIG. 4A, the in-phase and quadrature components of each sample are converted by the $N_{bq}$ bit quantizer of the digital mapper 405 into two sets of quantization bits signals 406-$\{1, \ldots, N_{bq}\}$ and 407-$\{1, \ldots, N_{bq}\}$, respectively. The quantization bits 406-$\{1, \ldots, N_{bq}\}$ and 407-$\{1, \ldots, N_{bq}\}$ are used by an internal mapper in 405, that can be a lookup table, to generate the in-phase amplitude coefficients $|c_{I,i}|$ and the quadrature amplitude coefficients $|c_{q,i}|$, that are used in a voltage mapper in 405 to generate a set $N_{bq}$ control signals 410-$\{1, \ldots, N_{bq}\}$ to select the set of $V_{dd}$ values in the lookup table 434. The set of $V_{dd}$ values is selected in 434 according to the control signals 410-$\{1, \ldots, N_{bq}\}$ and the control signal 433 provided by the fast/slow power control block 432. The digital mapper 405 also provides an optional control signal 411 to the fast/slow power control block 432, to be used in the selection of correct set of $V_{dd}$ values in 434. Block 432 also receives a power control signal 431 from the system with information about the output power needed for the transmission.

The signals 406-$\{1, \ldots, N_{bq}\}$ and 407-$\{1, \ldots, N_{bq}\}$ are provided to the delay phase shifters and polar converter blocks 412 and 413, to generate the phase rotations associated to each quantization bit and the corresponding polar representation and adjust the delays between the signals associated to the quantization bits. For illustration purposes and not limitation, for the quantization bits of the in-phase component 406-$\{1, \ldots, N_{bq}\}$, the bit 0 corresponds a phase of n and for the bit 1 a phase of 0. For the quantization bits of quadrature component 407-$\{1, \ldots, N_{bq}\}$, the bit 0 corresponds a phase of $-\pi/2$ and for the bit 1 a phase of $\pi/2$. The blocks 412 and 413 adjust the delays and polarities of the outputs signals 414-$\{1, \ldots, N_{bq}\}$ and 415-$\{1, \ldots, N_{bq}\}$ according the desired offset to be applied between the in-phase and quadrature signals 414-$\{1, \ldots, N_{bq}\}$ and 415-$\{1, \ldots, N_{bq}\}$ and the feedback information provided by the control signal 442-$\{1, \ldots, N_{bq}\}$ from the multi amplifier amplification stage 427.

Both set of signals 414-$\{1, \ldots, N_{bq}\}$ and 415-$\{1, \ldots, N_{bq}\}$ may be submitted to a set of filters 416-$\{1, \ldots, N_{bq}\}$ and 417-$\{1, \ldots, N_{bq}\}$, with the same impulsive response, to assure the desired spectral shape.

The in-phase signals 418-$\{1, \ldots, N_{bq}\}$ are combined in 420-$\{1, \ldots, N_{bq}\}$ with the quadrature signals 419-$\{1, \ldots, N_{bq}\}$ to generate a set of constituent signals with quasi or constant envelope signals 421-$\{1, \ldots, N_{bq}\}$. Blocks 418c-$\{1, \ldots, N_{bq}\}$ and 419c-$\{1, \ldots, N_{bq}\}$ are optional, and when absent, the signals 418-$\{1, \ldots, N_{bq}\}$ and 418d-$\{1, \ldots, N_{bq}\}$, and 419-$\{1, \ldots, N_{bq}\}$ and 419d-$\{1, \ldots, N_{bq}\}$, are equal, respectively. The signals 421-$\{1, \ldots, N_{bq}\}$ are up converted to the RF frequency in 424-$\{1, \ldots, N_{bq}\}$ through a multiplication by a periodic signal 423 with the desired RF frequency defined by clock 404. The signals 425-$\{1, \ldots, N_{bq}\}$ with quasi or constant envelope are the inputs of the corresponding power amplifiers (PAs) 426-$\{1, \ldots, N_{bq}\}$ of the amplification stage. In another embodiment PAs 426-$\{1, \ldots, N_{bq}\}$ include switched power amplifiers of class D. In another embodiment PAs 426-$\{1, \ldots, N_{bq}\}$ include switched power amplifiers of class E, F, S, or other class of switched power amplifiers.

Each PA in the set of $N_{bq}$ amplifiers 427 has a unique $V_{dd}$ voltage value from the set of $V_{dd}$ values 438-$\{1, \ldots, N_{bq}\}$ applied to the amplification stage with $N_{bq}$ amplifiers 427. The $V_{dd}$ values 438-$\{1, \ldots, N_{bq}\}$ applied to the $N_{bq}$ amplifiers 426-$\{1, \ldots, N_{bq}\}$ are the outputs of the power and $V_{dd}$ control block 439 composed by the fast and slow power control block 432, the lookup table 434 that sends the control signals 435-$\{1, \ldots, N_{bq}\}$ to the DC-DC converter 436 that define the set of $V_{dd}$ values 437-$\{1, \ldots, N_{bq}\}$ to be generated by the DC/DC converter. Block 437a is an optional LDO. When block 437a is absent signals 437-$\{1, \ldots, N_{bq}\}$ and 438-$\{1, \ldots, N_{bq}\}$ are equal. The supply signal 443 is used by the DC/DC converter 436 (and by the optional LDO 437a) to generate the set of $V_{dd}$ values and bias signals, used in the amplification stage 427.

The outputs of PAs 428-$\{1, \ldots, N_{bq}\}$ are coupled together in a combiner 429 using well known combining techniques such as active combiners or other techniques such as Wilkinson, hybrid or transformers. Alternatively, the outputs of PAs 428-$\{1, \ldots, N_{bq}\}$ can be coupled through LC matching for a minimal power loss. Amplification stage embodiments according to power amplification methods and systems of the present invention will further described in section 3.

The phase control circuit 441 is employed to generate feedback control signals 442-$\{1, \ldots, N_{bq}\}$ to blocks 412 and 413 to compensate phase mismatches among amplifiers, based on the information signals 440-$\{1, \ldots, N_{bq}\}$.

In other embodiments the signal 423 can be a sinusoidal signal or a pulse train signal with frequency selected according to the desired frequency of the output signal.

In other embodiments the combiner's output signal 430 is submitted to a bandpass filter with central frequency equal to the desired carrier frequency of the output signal.

Figure 4B:
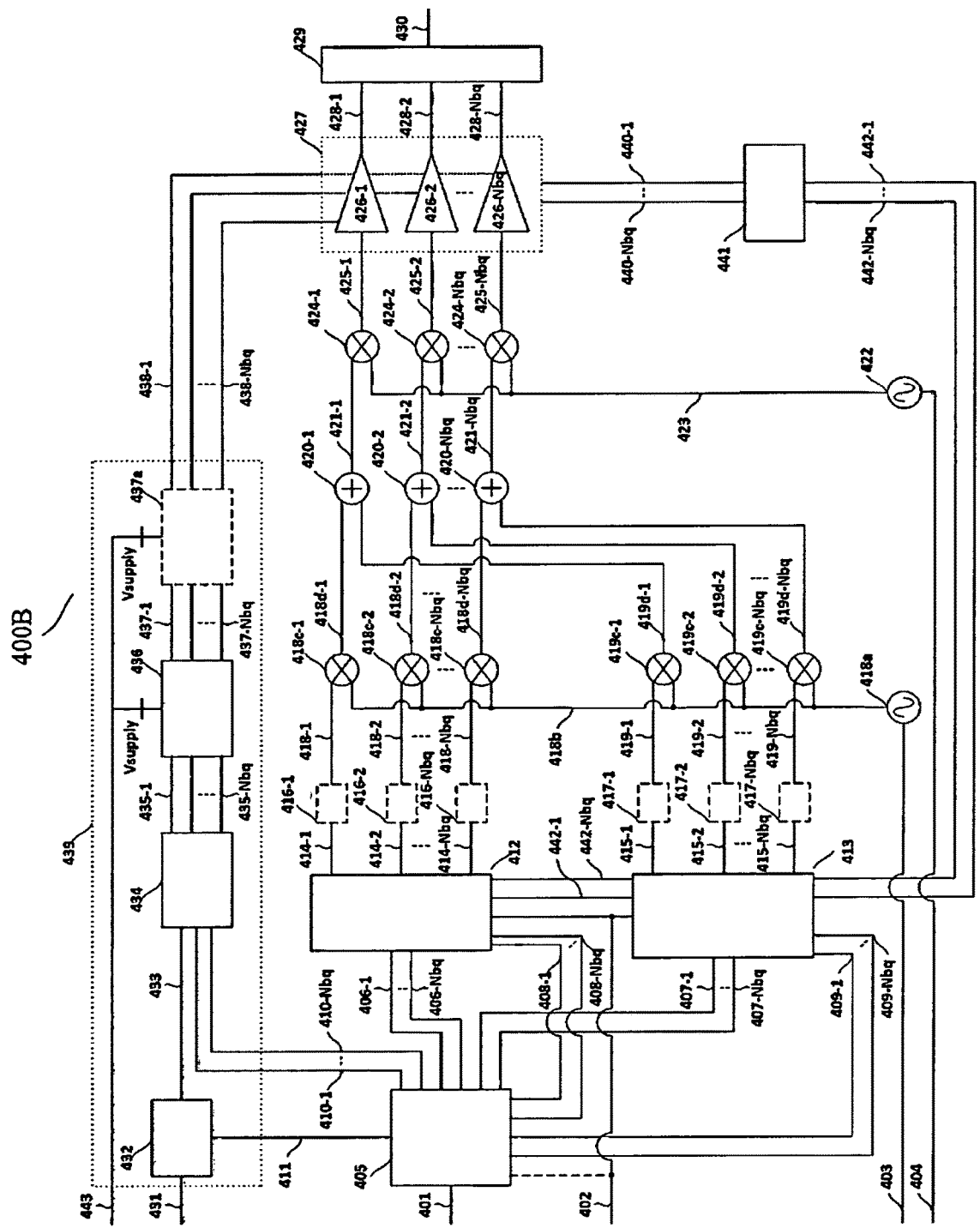
FIG. 4B is a block diagram that illustrates an exemplary embodiment of a multi quantized digitally controlled power supply voltage for multi amplifier stages apparatus for switched amplifiers and where the resulting the polar quadrature components signals are multiplied by a periodic signal in an intermediate frequency before being up-converted.

Block diagram 400B of FIG. 4B is an example that illustrates an embodiment of the MQDCPSVMASSA, implementing the process flowchart 300 of FIG. 3, with the optional step 311. In the example of FIG. 4B, optional components are illustrated with dashed lines. In other embodiments, additional components may be optional.

In this example a time varying envelope signal 401, a clock reference signal 402 for the sampling process, an intermediate channel clock 403, with the desired intermediate frequency, and a RF channel clock 404 with the desired frequency for the output signal are received as inputs. In another embodiment the signal 401 can be the samples of a time-varying envelope signal and the S/H inside of the digital mapper 405 is not required. In other embodiments signal 401 can be a baseband signal, or IF signal. In FIG. 5 is illustrated an exemplary embodiment of the digital mapper 405.

The clock reference signal 402 can be used by the digital mapper 405, by the delay phases shifters polar converters blocks 412 and 413. The common clock signal 402 is used to ensure that the outputs of quantizer 406-$\{1, \ldots, N_{bq}\}$ and 407-$\{1, \ldots, N_{bq}\}$ are time aligned and to ensure that the outputs of blocks 412 and 413 are synchronized. It can be understood by a person skilled in the art that the choice of the clock reference signal 402 is made according the bandwidth of the input signal and the desired output signal.

In the digital mapper 405 the signal carrying the information is sampled according to a clock signal 402 and are generated the in-phase and quadrature components of each sample. Still referring to FIG. 4B, the in-phase and quadrature components of each sample are converted by the $N_{bq}$ bit quantizer of the digital mapper 405 into two sets of quantization bits signals 406-$\{1, \ldots, N_{bq}\}$ and 407-$\{1, \ldots, N_{bq}\}$, respectively. The quantization bits 406-$\{1, \ldots, N_{bq}\}$ and 407-$\{1, \ldots, N_{bq}\}$ are used by an internal mapper in 405, that can be a lookup table, to generate the in-phase amplitude coefficients $|c_{I,i}|$ and the quadrature amplitude coefficients $|c_{q,i}|$ that are used in a voltage mapper in 405 to generate a set $N_{bq}$ control signals 410-$\{1, \ldots, N_{bq}\}$ to select the set of $V_{dd}$ values in the lookup table 434. The set of $V_{dd}$ values is selected in 434 according the control signals 410-$\{1, \ldots, N_{bq}\}$ and the control signal 433 provided by the fast/slow power control block 432. The digital mapper 405 also provides an optional control signal 411 to the fast/slow power control block 432, to be used in the selection of correct set of $V_{dd}$ values in 434.

The signals 406-$\{1, \ldots, N_{bq}\}$ and 407-$\{1, \ldots, N_{bq}\}$ are provided to the delay phase shifters and polar converter blocks 412 and 413, to generate the phase rotations associated to each quantization bit and the corresponding polar representation and adjust the delays between the signals associated to the quantization bits. For illustration purposes and not limitation, for the quantization bits of the in-phase component 406-$\{1, \ldots, N_{bq}\}$, the bit 0 corresponds a phase of it and for the bit 1 a phase of 0. For the quantization bits of quadrature component 407-$\{1, \ldots, N_{bq}\}$, the bit 0 corresponds a phase of $-\pi/2$ and for the bit 1 a phase of $\pi/2$. The blocks 412 and 413 adjust the delays and polarities of the outputs signals 414-$\{1, \ldots, N_{bq}\}$ and 415-$\{1, \ldots, N_{bq}\}$ according the desired offset to be applied between the in-phase and quadrature signals 414-$\{1, \ldots, N_{bq}\}$ and 415-$\{1, \ldots, N_{bq}\}$ and the feedback information provided by the control signal 442-$\{1, \ldots, N_{bq}\}$ from the multi amplifier amplification stage 427.

Both set of signals 414-$\{1, \ldots, N_{bq}\}$ and 415-$\{1, \ldots, N_{bq}\}$ could be submitted to a set of filters 416-$\{1, \ldots, N_{bq}\}$ and 417-$\{1, \ldots, N_{bq}\}$, with the same impulsive response, to assure the desired spectral shape.

In-phase signals 418d-$\{1, \ldots, N_{bq}\}$ in an intermediate frequency are obtained by multiplying in 418c-$\{1, \ldots, N_{bq}\}$ the signals 418-$\{1, \ldots, N_{bq}\}$ by a pulse periodic signal 418b with the desired intermediate frequency. IF quadrature signals 419d-$\{1, \ldots, N_{bq}\}$ are obtained by multiplying in 419c-$\{1, \ldots, N_{bq}\}$ the signals 419-$\{1, \ldots, N_{bq}\}$ by a pulse periodic signal 418b with the desired intermediate frequency. The in-phase signals 418d-$\{1, \ldots, N_{bq}\}$ are combined in 420-$\{1, \ldots, N_{bq}\}$ with the quadrature signals 419d-$\{1, \ldots, N_{bq}\}$ to generate a set of constituent signals with quasi or constant envelope signals 421-$\{1, \ldots, N_{bq}\}$. The signals 421-$\{1, \ldots, N_{bq}\}$ are up converted to the RF frequency in 424-$\{1, \ldots, N_{bq}\}$ through a multiplication by a periodic signal 423 with the desired RF frequency defined by clock 404. The signals 425-$\{1, \ldots, N_{bq}\}$ with quasi or constant envelope are the inputs of the corresponding power amplifiers (PAs) 426-$\{1, \ldots, N_{bq}\}$ of the amplification stage. In another embodiment PAs 426-$\{1, \ldots, N_{bq}\}$ include switched power amplifiers of class D. In another embodiment PAs 426-$\{1, \ldots, N_{bq}\}$ include switched power amplifiers of class E, F, S, or other class of switched power amplifiers.

Each PA in the set of $N_{bq}$ amplifiers 427 has a unique $V_{dd}$ voltage value from the set of $V_{dd}$ values 438-$\{1, \ldots, N_{bq}\}$ applied to the amplification stage with $N_{bq}$ amplifiers 427. The $V_{dd}$ values 438-$\{1, \ldots, N_{bq}\}$ applied to the $N_{bq}$ amplifiers 426-$\{1, \ldots, N_{bq}\}$ are the outputs of the power and $V_{dd}$ control block 439 composed by the fast and slow power control block 432, the lookup table 434 that sends the control signals 435-$\{1, \ldots, N_{bq}\}$ to the DC/DC converter 436 that define the set of $V_{dd}$ values 437-$\{1, \ldots, N_{bq}\}$ to be generated by the DC/DC converter. Block 437a is an optional LDO. When block 437a is absent signals 437-$\{1, \ldots, N_{bq}\}$ and 438-$\{1, \ldots, N_{bq}\}$ are equal. The supply signal 443 is used by the DC/DC converter 436 (and by the optional LDO 437a) to generate the set of $V_{dd}$ values and bias signals, used in the amplification stage 427.

The outputs of PAs 428-$\{1, \ldots, N_{bq}\}$ are coupled together in a combiner 429 using well known combining techniques such as active combiners or other techniques such as Wilkinson, hybrid or transformers. Alternatively, the outputs of PAs 428-$\{1, \ldots, N_{bq}\}$ can be coupled through LC matching for a minimal power loss. Amplification stage embodiments according to power amplification methods and systems of the present invention will further described in section 3.

In another embodiment a phase control circuit 441 could be employed to generate feedback control signals 442-$\{1, \ldots, N_{bq}\}$ to blocks 412 and 413 to compensate phase mismatches among amplifiers, based on the information signals 440-$\{1, \ldots, N_{bq}\}$.

In other embodiments the signal 423 can be a sinusoidal signal or a pulse train signal with frequency selected according to the desired frequency of the output signal.

In other embodiments the combiner's output signal 430 is submitted to a bandpass filter with central frequency equal to the desired carrier frequency of the output signal.

Block diagram 500 of FIG. 5 is an example that illustrates an embodiment of the digital mapper block of FIGS. 2A and 2B (block 205) and FIGS. 4A and 4B (block 405). In this example a time varying envelope signal 501, a clock reference signal 502 for the sampling process are received as inputs. In another embodiment 501 can be the samples of a time-variant envelope signal and the S/H 503 is not required. In another embodiment the input signal 501 can be the samples of the in-phase and quadrature components of a time varying envelope signal and the phase splitter 505 and the S/H are not required.

The clock reference signal 502 can be used by the S/H block 503, by the I/Q block 505, by the quantizer 508, by the amplitude component mapper 513 and by the $V_{dd}$ voltage mapper 517. Samples 504 are provided to the phase splitter 505 that generates the in-phase and quadrature components 506 and 507 for each sample. Signals 506 and 507 are supplied to the quantizer 508, that generates the quantization bits 511-$\{1, \ldots, N_{bq}\}$ and 512-$\{1, \ldots, N_{bq}\}$, which are used by the component amplitude mapper 513, that can be a lookup table, to generate the in-phase amplitude coefficients $|c_{I,i}|$ and the quadrature amplitude coefficients $|c_{q,i}|$.

The in-phase quantization bits 509-$\{1, \ldots, N_{bq}\}$ and the quadrature quantization bits 510-$\{1, \ldots, N_{bq}\}$ are the inputs of the blocks 212 and 213 of FIGS. 2A and 2B. Referring to FIGS. 4A and 4B, signals 509-$\{1, \ldots, N_{bq}\}$ and 510-$\{1, \ldots, N_{bq}\}$ correspond to inputs of blocks 412 and 413.

Two sets of signals with amplitude coefficients 514-$\{1, \ldots, N_{bq}\}$ and 515-$\{1, \ldots, N_{bq}\}$ are generated according the decomposition rule applied to the quantized values of the in-phase and quadrature components into fixed amplitude components and sent to the blocks 216 and 217 of FIGS. 2A and 2B. Referring FIGS. 2A and 2B, signals 514-$\{1, \ldots, N_{bq}\}$ and 515-$\{1, \ldots, N_{bq}\}$ correspond to the signals 208-$\{1, \ldots, N_{bq}\}$ and 209-$\{1, \ldots, N_{bq}\}$. Referring FIGS. 4A and 4B, signals 514-$\{1, \ldots, N_{bq}\}$ and 515-$\{1, \ldots, N_{bq}\}$ are not needed to control any amplitude adjustment of the signal components. Another set of control signals proportional to the amplitude coefficients are generated 516-$\{1, \ldots, N_{bq}\}$ and delivered to the $V_{dd}$ voltage mapper 517. These signals are used at $V_{dd}$ voltage mapper in 517 to generate a set $N_{bq}$ control signals 518-$\{1, \ldots, N_{bq}\}$ that correspond to the signals 210-$\{1, \ldots, N_{bq}\}$ of FIGS. 2A and 2B or to the signals 410-$\{1, \ldots, N_{bq}\}$ of FIGS. 4A and 4B. The set of $V_{dd}$ values 518-$\{1, \ldots, N_{bq}\}$ is generated according the control signals 516-$\{1, \ldots, N_{bq}\}$. The $V_{dd}$ voltage mapper 517 also provides an optional control signal 519 (signal 211 in FIGS. 2A and 2B or signal 411 in FIGS. 4A and 4B) to the fast/slow power control block of FIGS. 2A and 2B.

It can be understood by a person skilled in the art that the choice of the clock reference signal is made according the bandwidth of the input signal and the desired output signal. As understood by a person skilled in the art, other reference clock signals and different reference clock signals may be used by the different blocks. It is noted that one quantizer is employed together with two mappers for purposes of illustration, and not limitation. The scope of the invention covers the use of more quantizers and different number of mappers, and implementation of such variations will be apparent to persons skilled in the art based on the teachings contained herein. In yet another exemplary embodiment, an apparatus for digital mapper block may include a FPGA and lookup tables. The phase splitter may add an offset between the in-phase and quadrature samples.

3. Parallel Amplifier Stage Embodiments

Figure 6:
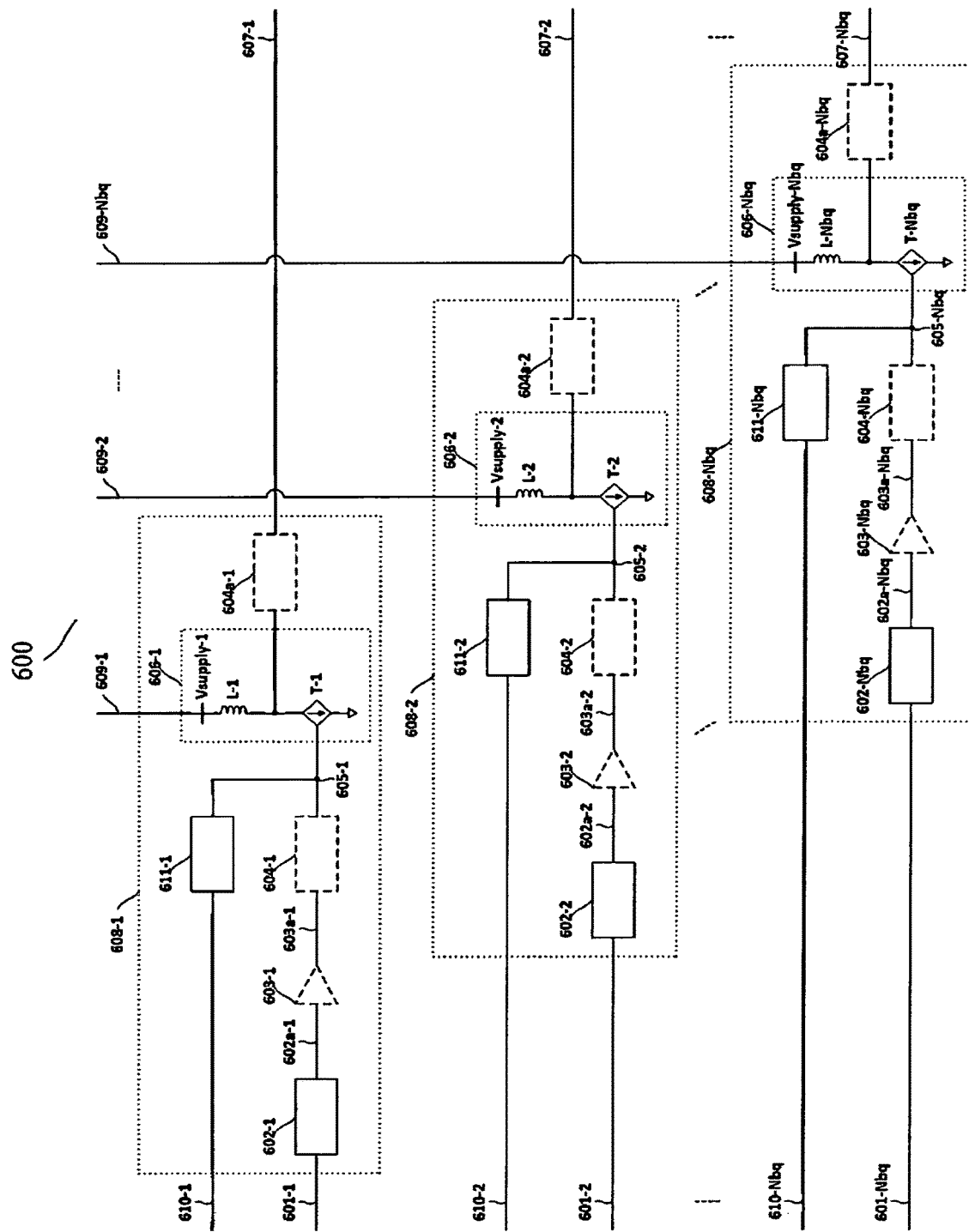
FIG. 6 is a block diagram that illustrates an exemplary embodiment for implementing a class A amplification stage in a multi quantized digitally controlled power supply voltage for multi amplifier stages method.

Block diagram 600 of FIG. 6, illustrates a parallel and multi power amplifier stage embodiment with transconductance based amplifiers, namely for class A operation, according to an embodiment of the present invention. In the example of FIG. 6, optional components are illustrated with dashed lines. In other embodiments, additional components may be optional. The amplifier stage embodiment 600 includes a plurality of PA branches 608-$\{1, \ldots, N_{bq}\}$. Signals 601-$\{1, \ldots, N_{bq}\}$ incoming from respective mixing products of the constituent signals components by a periodic signal represent inputs for the overall amplification stage 600. Referring FIGS. 2A and 2B, the input signals are the signals 229-$\{1, \ldots, N_{bq}\}$.

PA branches 608-$\{1, \ldots, N_{bq}\}$ outputs have different power levels as the result of amplification of respective signals 601-$\{1, \ldots, N_{bq}\}$ according the supply voltage value $V_{dd}$, applied to each power amplifier branch. The power amplification level of each PA branch 608-$\{1, \ldots, N_{bq}\}$ is set according to the input signal and the power supply signals and input control signals 242-$\{1, \ldots, 2N_{bq}\}$ (see FIGS. 2A and 2B).

The control signals 610-$\{1, \ldots, N_{bq}\}$ are used by the bias and control circuit block 611-$\{1, \ldots, N_{bq}\}$. This block sets the desired operating point of the power amplifier cells 606-$\{1, \ldots, N_{bq}\}$. Referring FIGS. 2A and 2B, the control signals are signals 606-$\{1, \ldots, N_{bq}\}$ that are provided by the LUT 238.

In the embodiment of FIG. 6, each PA branch 608-$\{1, \ldots, N_{bq}\}$ includes a limiter 602-$\{1, \ldots, N_{bq}\}$, an optional driver 603-$\{1, \ldots, N_{bq}\}$, an optional output matching network 604-$\{1, \ldots, N_{bq}\}$ and a power amplifier unit cell 606-$\{1, \ldots, N_{bq}\}$. In other embodiments, an input matching network can be also used. In other embodiments, power drivers 603-$\{1, \ldots, N_{bq}\}$ as illustrated in FIG. 6, may also be added in a PA branch prior to the power amplifier element to reinforce the input signal 605-$\{1, \ldots, N_{bq}\}$. When power drivers 603-$\{1, \ldots, N_{bq}\}$ are not employed, the signals at the limiter output 602a-$\{1, \ldots, N_{bq}\}$ are equal to signals 603a-$\{1, \ldots, N_{bq}\}$. In embodiments, power drivers are employed whenever a required output power level may not be achieved in a single amplifying stage due to insufficient driving power. According to embodiment 600, PAs 606-$\{1, \ldots, N_{bq}\}$ include a transconductance based amplifier. In the example of FIG. 6, power amplifiers 606-$\{1, \ldots, N_{bq}\}$ include transconductance devices, namely Field Effect Transistor (FET), T-$\{1, \ldots, N_{bq}\}$, inductors L-$\{1, \ldots, N_{bq}\}$, and supply voltages Vsupply-$\{1, \ldots, N_{bq}\}$, which are provided by signals 609-$\{1, \ldots, N_{bq}\}$. Referring FIGS. 2A and 2B, the supply and bias signals are the set of signals 242-$\{1, \ldots, 2N_{bq}\}$ and the outputs of PA branches 607-$\{1, \ldots, N_{bq}\}$ are coupled at the combiner 233 to generate the output signal 234.

Figure 7:
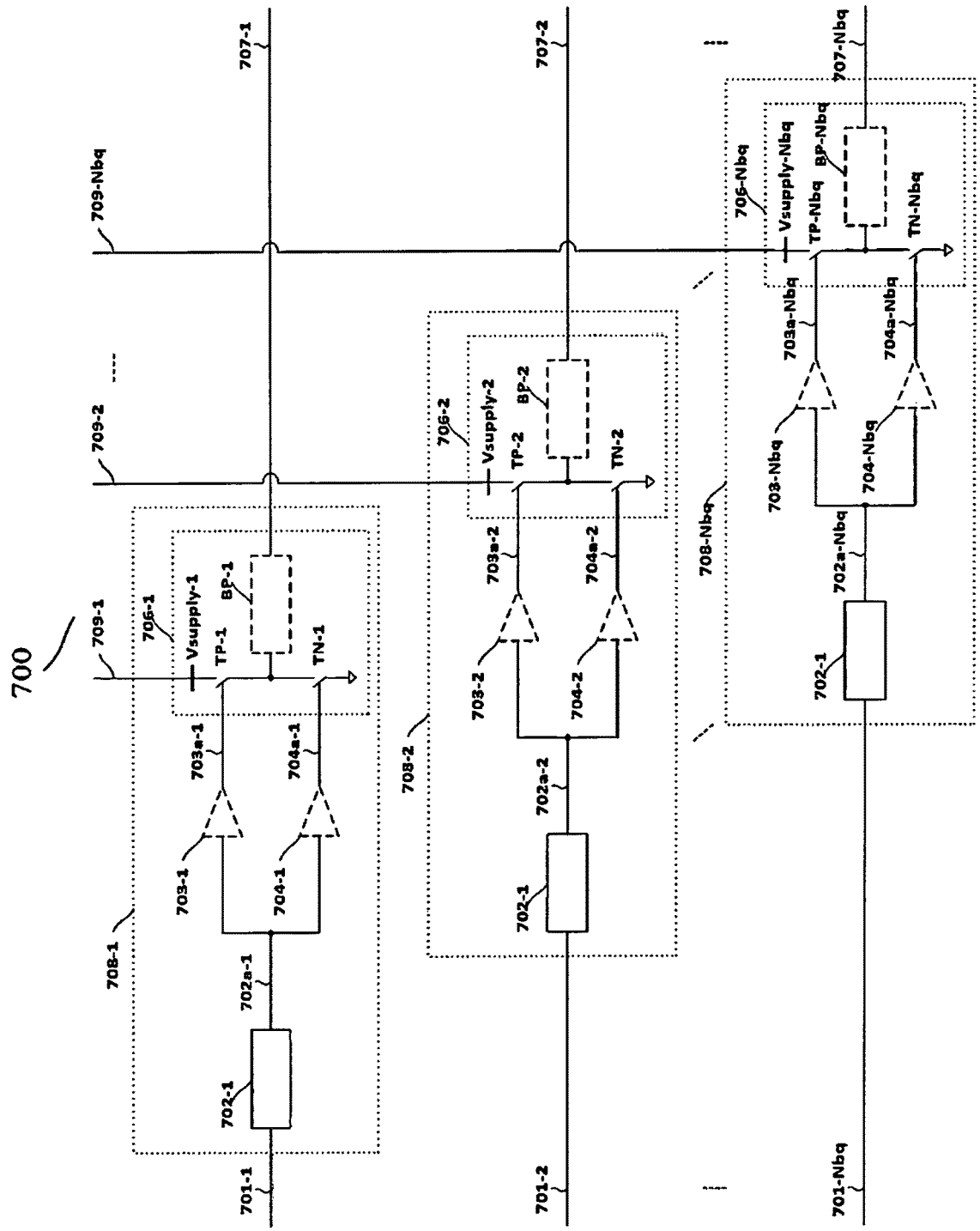
FIG. 7 is a block diagram that illustrates another exemplary embodiment for implementing a class D amplification stage in a multi quantized digitally controlled power supply voltage for multi amplifier stages.

Block diagram 700 of FIG. 7 illustrates another multi power amplifier output stage with switched based amplifiers branches, namely on class D operation, according to an embodiment of the present invention. In the example of FIG. 7, optional components are illustrated with dashed lines. In other embodiments, additional components may be optional. Similarly to the embodiment of FIG. 6, the output stage 700 of FIG. 7 includes a plurality of PA branches 708-$\{1, \ldots, N_{bq}\}$. Signals 701-$\{1, \ldots, N_{bq}\}$ incoming from respective the products of the constituent signals components by a periodic signal represent inputs for amplification stage 700. Referring FIGS. 4A and 4B, the input signals are the set of signals 425-$\{1, \ldots, N_{bq}\}$. According to this embodiment of the present invention, signals 701-$\{1, \ldots, N_{bq}\}$ represent the constant envelope constituent signals at the inputs of the power amplifiers.

Each of PA branch 708-$\{1, \ldots, N_{bq}\}$ may include multiple power amplification stages represented by a limiter 702-$\{1, \ldots, N_{bq}\}$ that provides a signal 702a-$\{1, \ldots, N_{bq}\}$ to the power drivers in parallel 703-$\{1, \ldots, N_{bq}\}$ and 704-$\{1, \ldots, N_{bq}\}$ each one providing an input signal 703a-$\{1, \ldots, N_{bq}\}$ and 704a-$\{1, \ldots, N_{bq}\}$, respectively, to the corresponding switches TP-$\{1, \ldots, N_{bq}\}$ and TN-$\{1, \ldots, N_{bq}\}$ of each power amplifier 706-$\{1, \ldots, N_{bq}\}$.

Power amplifiers 706-$\{1, \ldots, N_{bq}\}$ have power supply voltages Vsupply-$\{1, \ldots, N_{bq}\}$, which are provided by signals 709-$\{1, \ldots, N_{bq}\}$. Referring FIGS. 4A and 4B, these signals are the set of signals 438-$\{1, \ldots, N_{bq}\}$. To generate the desired output signal, the outputs of PA branches 707-$\{1, \ldots, N_{bq}\}$ are coupled in the combiner 429 of FIGS. 4A and 4B to generate the output signal 430. Accordingly, minimal power loss is incurred in summing the outputs of PAs 707-$\{1, \ldots, N_{bq}\}$. In other embodiments, an input and output matching networks can be also used.

Embodiments are not limited to switches based on type of FET channel N and P devices. A person skilled in the art will appreciate, for example, that embodiments of the present invention may be implemented using Bipolar Junction Transistors (BJTs), Complementary MOS (CMOS), N-type MOS (NMOS), P-channel MOS (PMOS), Laterally Diffused MOS (LDMOS), BiCMOS or other type of semiconductor based transistors. Furthermore, embodiments can be implemented using Gallium Arsenide (GaAs), Gallium Nitride (GaN) and/or Silicon-Germanium (SiGe) and silicon transistors with the desired transistor switching speed and ON-resistance.

In embodiments, the number of transistors included within each PA is set according to a required maximum output power level of the power amplifier. In other embodiments, the number of transistors in the PA is such that the numbers of transistors in the pre-driver, driver, and PA stages conform to an optimized progression.

While preferred embodiments of the present disclosure have been described above, the present disclosure is not limited to the specific configurations described above. Various variations and modifications may be made without departing from the scope of the present disclosure. It should be understood by those skilled in the art that various modifications, combinations, sub-combinations and alterations may occur depending on design requirements and other factors insofar as they are within the scope of the appended claims or the equivalents thereof.

4. Summary

Mathematical basis for a new concept related to processing signals to provide power amplification is provided herein. These new concepts allow arbitrary waveforms to be constructed from sums of waveforms which are substantially constant envelope in nature. Desired output signals and waveforms may be constructed from the amplified versions of substantially constant envelope constituent signals which can be created from the knowledge and quantization of the time varying envelope of the input signal and the use of a multiplicity of power amplifiers with a multiplicity of outputs powers. The amplified version of the quantized signal is generated by using multiple amplifiers with different power outputs which are summed using novel techniques not available commercially, not taught or found in literature or related art. Furthermore, the blend of various techniques and circuits provided in the disclosure provide unique aspects of the invention which permits superior linearity, power added efficiency, constant supply voltages on the power amplifiers and low cost. Embodiments of the invention can be implemented by a blend of hardware, software and firmware. Both digital and analog techniques can be used with or without microprocessors and DSP's (digital signal processors) or with or without FPGAs. The digital processing offers higher flexibility for the implementation of the multi $V_{dd}$ digital controlled system.

Embodiments of the invention can be implemented for communications systems and electronics in general. In addition, and without limitation, mechanics, electro mechanics, electro optics, and fluid mechanics can make use of the same principles for efficiently amplifying and transducing signals.

5. Conclusions

The present invention has been described above with the aid of functional building blocks illustrating the functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One person skilled in the art will recognize that these functional building blocks can be implemented by discrete components, application specific integrated circuits, processors executing appropriate software and the like and combinations thereof.

While various embodiments of the present invention have been described above, it should be understood that they have been presented by way of example only, and not limitation.

Thus, the breadth and scope of the present invention should not be limited by any of the above-described exemplary embodiments but should be defined only in accordance with the following claims and their equivalents.

What is claimed is:

1. A method for power amplification with multi quantized digitally controlled power supply voltage on amplifier stages, comprising the following steps:

receiving an input signal carrying the information to be transmitted;

receiving a first clock signal with a value set according to a signal frequency of the input signal;

receiving a second clock signal with a value set according to a desired sampling rate of the input signal;

receiving a third clock signal in accordance with a desired output signal frequency of a desired output signal;

receiving a slow and fast power control information to control an output power of an amplification stage with $N_{bq}$ power amplifiers, where $N_{bq}$ denotes the number of power amplifiers, by selecting different sets of $N_{bq}$ supply voltage values $V_{dd}$ to be applied to the $N_{bq}$ power amplifiers over different information blocks or over each data block of the input signal carrying the information;

sampling said input signal carrying the information in accordance with the desired sampling rate to generate samples of the input signal;

processing the samples of the input signal to generate an in-phase and a quadrature component of each sample;

processing in a quantizer with $N_{bq}$ quantization bits, where $N_{bq}$ denotes the number of quantization bits equal to the number of power amplifiers, the quantization of said in-phase and quadrature components of each sample to generate $N_{bq}$ quantization bits that correspond to a quantized value of said in-phase component and $N_{bq}$ quantization bits that correspond to a quantized value of the quadrature component, respectively;

processing individually in a digital mapper the $N_{bq}$ quantization bits of the quantized value of the in-phase component to generate a corresponding amplitude and phase of a polar representation of each quantization bit and processing individually the $N_{bq}$ quantization bits of the quantized value of the quadrature component to generate an amplitude and a phase of a polar representation of each quantization bit, wherein the amplitude associated to each quantization bit is defined according to a decomposition of the quantized value into polar components with amplitudes given by the sets with $N_{bq}$ amplitudes $|c_{I,i}|$ and $N_{bq}$ amplitudes $|c_{q,i}|$ for the in-phase and quadrature component, respectively;

processing said sets with $N_{bq}$ amplitudes $|c_{I,i}|$ and $N_{bq}$ amplitudes $|c_{q,i}|$ of polar components of the decomposition of the in-phase and quadrature component, to generate a control information that selects the set of $N_{bq}$ supply voltage values $V_{dd}$ to be applied to the $N_{bq}$ amplifiers;

processing the polar components of in-phase component by multiplying by a pulse signal with a desired spectral shape and processing the polar components of quadrature component by multiplying by a pulse signal with a desired spectral shape;

processing the in-phase signals and quadrature signals by summing pairs of signals with same amplitude to generate a set of $N_{bq}$ constituent signals with constant envelope and a sum equal to the quantized version of the input signal carrying the information;

multiplying the resulting set of $N_{bq}$ constituent signals with constant envelope by a periodic signal with the frequency of a radio frequency (RF) signal;

biasing the $N_{bq}$ power amplifiers of the amplification stage with a set of $N_{bq}$ supply voltage values $V_{dd}$, and/or drive currents, according to the decomposition of the quantized values into polar components and the slow and fast power control information;

amplifying each one of the $N_{bq}$ constituent signals in one of $N_{bq}$ power amplifiers of said amplification stage and summing in a combiner the amplified constituent signals to create the desired output signal.

2. The method according to claim 1, wherein said step of receiving said input signal carrying the information comprises:

receiving one band limited information signal with time varying envelope or receiving the in-phase and quadrature phase components of one band limited information signal with time varying envelope or receiving the samples of in-phase and quadrature component of one information band limited signal with time varying envelope or comprises receiving samples of one information band limited signal with time varying envelope.

3. The method according to claim 1, wherein the quantizer and digital mapper can be implemented in a single block using a single quantizer followed by a mapper for both in-phase and quadrature component of each sample or two quantizers followed by two mappers, each one for each in-phase and quadrature component, and wherein the quantization and the mapping can be performed by a comparator and a Look up table (LUT) with the corresponding quantization bits of the quantized value.

4. The method according to claim 1, wherein said step of quantizing the in-phase and quadrature component of each sample of said input signal carrying information to generate the quantization bits, may use a number of quantization bits that can change between different samples of said input signal.

5. The method according to claim 1, wherein the quantization and generation of polar components of said in-phase and quadrature component of each sample can be performed by a comparator and a look up table (LUT) with the corresponding amplitudes and phases of polar components for the $N_{bq}$ quantization bits or can be done once by a block that quantizes and generates directly the $N_{bq}$ quantization bits and the amplitudes and phases of polar components for the $N_{bq}$ quantization bits of the in-phase and quadrature components.

6. The method according to claim 1, wherein the generation of control information that selects the set of $N_{bq}$ supply voltage values $V_{dd}$ to be applied to the $N_{bq}$ power amplifiers can be performed by a look up table (LUT) with the supply voltage value $V_{dd}$ to be applied to each power amplifier or can be done once by a block that quantizes and generates directly the $N_{bq}$ quantization bits, the amplitudes and phases of polar components for the in-phase and quadrature components, and the control information for selecting the set of $N_{bq}$ supply voltage values $V_{dd}$.

7. The method according to claim 1, wherein:

said step of sampling comprises sampling said input signal in accordance with said desired sampling rate to generate the samples of the in-phase and quadrature components of the input signal carrying the information;

said step of quantization comprises two quantizers where one quantizer is employed in the quantization of in-phase component of each sample and generates $N_{bq}$ quantization bits that correspond to the quantized version of the sample and another quantizer employed to quantize the quadrature component of each sample and that generates $N_{bq}$ quantization bits that correspond to the quantized version of the sample of quadrature component;

said step of processing the sets with $N_{bq}$ amplitudes $|c_{I,i}|$ and $N_{bq}$ amplitudes $|c_{q,i}|$ for the in-phase and quadrature component, to generate the control information that selects the set of $N_{bq}$ supply voltage values $V_{dd}$ to be applied to the $N_{bq}$ amplifiers may also generate a set of $N_{bq}$ values of biasing currents to be applied to the $N_{bq}$ amplifiers.

8. The method according to claim 1, wherein a feedback can be coupled to each power amplifier to give information needed for a digital pre-distortion to compensate impairments of the amplifiers.

9. An apparatus for power amplification with multi quantized digitally controlled power supply voltage on amplifier stages, comprising:

an input circuitry that receives an input signal carrying the information to be transmitted;

an input circuitry that receives a clock signal with a value set according to a signal frequency of the input signal;

an input circuitry that receives a clock signal with a value set according to a desired sampling rate of the input signal;

an input circuitry that receives a clock signal in accordance with a desired output signal frequency of a desired output signal;

an input circuitry that receives a slow and fast power control information;

a sampling circuitry that samples the input signal carrying the information in accordance with the desired sampling rate to generate samples of the input signal carrying the information;

a digital mapper circuitry that processes the samples of said input signal to generate an in-phase and a quadrature component of each sample, wherein a quantizer circuitry with $N_{bq}$ quantization bits, where $N_{bq}$ denotes the number of quantization bits, performs the quantization of the in-phase and quadrature component to generate $N_{bq}$ quantization bits that correspond to a quantized value of the in-phase component and $N_{bq}$ quantization bits that correspond to a quantized value of the quadrature component, and processes in a mapper the $N_{bq}$ quantization bits of the quantized value of the in-phase component and quadrature component to generate an amplitude and phase of a polar representation of each quantization bit, wherein the amplitude associated to the polar representation of each quantization bit is defined according to a decomposition of the quantized value into polar components with amplitudes given by the sets with $N_{bq}$ amplitudes $|c_{I,i}|$ and $N_{bq}$ amplitudes $|c_{q,i}|$ for the in-phase and quadrature components, respectively;

a $V_{dd}$ voltage mapper circuitry that uses the signals provided by the digital mapper circuitry to generate a set of $N_{bq}$ control signals used to select the $N_{bq}$ supply voltage values $V_{dd}$ to be applied to the amplifiers of an amplification stage circuitry with $N_{bq}$ power amplifiers, according to the slow and fast power control information;

a circuitry with phase shifters and polar converters, that generates the phase rotations associated to the polar representation of each quantization bit and adjust delays between the polar signals associated to the quantization bits;

a circuitry that adjusts the amplitude of each in-phase polar signal according to the in-phase amplitude coefficients $|c_{I,i}|$ to generate $N_{bq}$ in-phase constituent signals and a circuitry that adjusts the amplitude of each quadrature polar signal according with the quadrature amplitude coefficients $|c_{q,i}|$ to generate $N_{bq}$ quadrature constituent signals;

a bank of filters with a same impulsive response, that receives the in-phase and quadrature constituent signals and filter them to assure a desired spectral shape;

a circuitry that combines pairs of in-phase constituent and quadrature constituent signals to generate a set of $N_{bq}$ constituent signals with quasi or constant envelope;

a circuitry that receives the $N_{bq}$ constituent signals with quasi or constant envelope and up-convert them by multiplying each one by a periodic signal, with the desired output signal frequency;

an amplification stage circuitry with $N_{bq}$ power amplifiers in parallel, that receives said constituent signals with quasi or constant, comprising at least $N_{bq}$ active power amplification branches with different power outputs levels controlled by a set of supply voltage values $V_{dd}$ provided by the digital mapper circuitry, wherein each one of the said constituent signals with quasi or constant envelope-is amplified by the power amplifier of his branch;

a combiner circuitry coupled to the $N_{bq}$ branches of said amplification stage circuitry that combines the outputs of the branches of said amplification stage circuitry according to the control signals of $V_{dd}$ voltage mapper circuitry.

10. The apparatus of claim 9, wherein said received input signal carrying the information by input circuitry comprises:
one band limited information signal with time varying envelope or the in-phase and quadrature components of one band limited information signal with time varying envelope or the samples of in-phase and quadrature components of one information band limited signal with time varying envelope or comprises the samples of one information band limited signal with time varying envelope.

11. The apparatus of claim 9, wherein:
said quantizer circuitry may comprise two quantizers in parallel where one quantizer is used to quantize the in-phase component of each sample and generates $N_{bq}$ quantization bits that correspond to the quantization of the in-phase component and another quantizer that quantizes the quadrature component of each sample to generate $N_{bq}$ quantization bits that correspond to the quantization of the quadrature component;

said digital mapper circuitry may comprises two mappers in parallel, with each one coupled to one quantizer, where one generates $N_{bq}$ constituent signal components in which the quantized value of said in-phase component of each sample is decomposed and a second one that generates $N_{bq}$ constituent signals components in which the quantized value of said quadrature component of each sample is decomposed, where the constituent signals components may have only a discrete number of amplitudes and discrete number of phases belonging to two sets of phases and amplitudes values with a maximum size equal to the number of quantization bits;

a circuitry that combines the in-phase's constituent signals components and quadrature's constituent signal components with same amplitude, that result from the said digital mapper circuitry, to generate a set of substantially constant envelope constituent signals whose sum is equal to the quantized sample of the signal.

12. The apparatus of claim 9, wherein:
said input circuitry receives the input signal carrying the information to be transmitted, receives the clock signal with the value set according to the signal frequency of the input signal, receives the clock signal with the value set according to the desired sampling rate of the input signal and receives the clock signal in accordance with the desired output signal frequency of the desired output signal;

a phase splitter circuitry is coupled to the sampling circuitry to receive the samples and generates the in-phase and quadrature components for each sample;

a quantizer circuitry is coupled to the sampling circuitry to quantize the in-phase and quadrature component of each samples and generates the quantization bits that correspond to the quantized value of each component;

said digital mapper circuitry receives the quantization bits from the quantizer and generates $N_{bq}$ constituent signal components in which the quantized value of each component is decomposed, wherein the constituent signal components are defined according to the decomposition of the quantized value as a sum of polar components with amplitudes given by the sets with $N_{bq}$ amplitudes $|c_{I,i}|$ and $N_{bq}$ amplitudes $|c_{q,i}|$ for the in-phase and quadrature component, and generates control signals, proportional to the amplitude coefficients $|c_{I,i}|$ and $|c_{q,i}|$ to be used by the $V_{dd}$ voltage mapper;

said $V_{dd}$ voltage mapper generates a set of $N_{bq}$ control signals to control the supply voltage values $V_{dd}$ values and generates a digital control signal for a fast/slow power control block circuitry.

13. The apparatus of claim 9, wherein said input circuitry that receives the input signal carrying the information, said input circuitries that receive clock signals, said sampling circuitry, said digital mapper circuitry, said quantizer circuitry, said $V_{dd}$ voltage mapper circuitry, said circuitry with phase shifters and polar converters, said bank of filters may be implemented by discrete electronic components, digital signal processors or by software in field programmable gate arrays (FPGA).

14. The apparatus of claim 9, wherein each of the $N_{bq}$ power amplifiers of the amplification stage circuitry has a unique supply voltage value $V_{dd}$ from the set of supply voltage values $V_{dd}$ and a bias applied to the amplification stage circuitry, and where the supply voltage values $V_{dd}$ and the bias applied to the $N_{bq}$ amplifiers, are the output of a fast/slow power control block circuitry that sends the control signals to a direct current/direct current (DC/DC) converter circuitry that define the set of $V_{dd}$ values to be generated by the DC/DC converter.

15. The apparatus of claim 9, further comprising a low-dropout regulator (LDO) to generate the set of supply voltage values $V_{dd}$ and bias signals, used in the amplification stage.

16. The apparatus of claim 9, wherein the outputs of the $N_{bq}$ power amplifiers of amplification stage circuitry have different power levels according to the supply voltage value $V_{dd}$ applied to each power amplifier branch.

17. The apparatus of claim 9, wherein:
  each power amplification branch may include multiple power amplification stages represented by a limiter that provides a signal to power drivers in parallel, each one providing an input signal to the switches of each power amplifier;
  each power amplifier may include two complementary switches based on transistors, followed by a bandpass filter, composed by passive reactive elements like capacitors and inductors.

18. The apparatus of claim 9, wherein said digital mapper circuitry comprises one or more look up tables which are used to process quantization bits and said digital control signals.

19. The apparatus of claim 9, wherein said amplification stage circuitry with $N_{bq}$ power amplifiers in parallel comprises a plurality of power amplifiers that may be current source amplifiers or switched amplifiers.

20. The apparatus of claim 9, wherein said amplification stage circuitry with $N_{bq}$ power amplifiers in parallel:
  may comprise a plurality of bipolar junction transistors (BJTs) of type NPN or of type PNP or;
  may comprise a plurality of Field Effect Transistors (FETs) with N or P Channels or;
  may comprise a plurality of Field Effect Transistors (FETs) with N or P Channels, using silicon based on metal-oxide-semiconductor (MOS) technology or;
  may comprise a plurality of Field Effect Transistors (FETs) with N or P Channels, using Gallium arsenide (GaAs) technology, Gallium nitride (GaN) technology and/or silicon-germanium (SiGe) technology.

* * * * *